(12) United States Patent
Salman et al.

(10) Patent No.: US 8,013,393 B2
(45) Date of Patent: Sep. 6, 2011

(54) ELECTROSTATIC DISCHARGE PROTECTION DEVICES

(75) Inventors: Akram Salman, Santa Clara, CA (US); Stephen Beebe, Los Altos, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 248 days.

(21) Appl. No.: 11/771,565

(22) Filed: Jun. 29, 2007

(65) Prior Publication Data

US 2009/0001472 A1   Jan. 1, 2009

(51) Int. Cl.
*H01L 23/62* (2006.01)

(52) U.S. Cl. . 257/355; 257/173; 257/356; 257/E29.008; 257/E29.014; 438/140

(58) Field of Classification Search .................. 257/172, 257/173, 355, 356, E29.008, E29.014, E29.226, 257/347, 348, E21.703; 438/380, 140, 454, 438/144; 361/100
See application file for complete search history.

(56) References Cited

U.S. PATENT DOCUMENTS

| 5,637,900 | A * | 6/1997 | Ker et al. ...................... 257/355 |
| 6,274,910 | B1 | 8/2001 | Yu |
| 6,594,132 | B1 | 7/2003 | Avery |
| 6,737,682 | B1 * | 5/2004 | Yu ................................. 257/173 |
| 6,768,619 | B2 | 7/2004 | Ker et al. |
| 6,847,082 | B2 * | 1/2005 | Ichikawa ....................... 257/353 |
| 6,894,351 | B2 * | 5/2005 | Okawa et al. .................. 257/347 |
| 7,675,116 | B2 * | 3/2010 | Fukuda ........................... 257/355 |
| 2002/0074602 | A1 * | 6/2002 | Lin et al. ........................ 257/355 |
| 2002/0122280 | A1 | 9/2002 | Ker et al. |
| 2003/0007301 | A1 | 1/2003 | Ker |
| 2005/0185351 | A1 * | 8/2005 | Miller et al. .................... 361/56 |
| 2007/0012945 | A1 | 1/2007 | Sugizaki |
| 2007/0040221 | A1 | 2/2007 | Gossner |

(Continued)

FOREIGN PATENT DOCUMENTS

EP   0852400 A   8/1998

OTHER PUBLICATIONS

International Search Report for International Application No. PCT/US2007/020594 mailed Feb. 7, 2008.

(Continued)

*Primary Examiner* — Lynne A Gurley
*Assistant Examiner* — Yosef Gebreyesus
(74) *Attorney, Agent, or Firm* — Ingrassia Fisher & Lorenz, P.C.

(57) ABSTRACT

A method for fabricating a semiconductor device is provided. According to this method, a first gate electrode and a second gate electrode are formed overlying a first portion of a silicon substrate, and ions of a first conductivity-type are implanted into a second portion of the silicon substrate to define a first conductivity-type diode region within the silicon substrate. Ions of a second conductivity-type are implanted into a third portion of the silicon substrate to define a second conductivity-type diode region within the silicon substrate. During one of the steps of implanting ions of the first conductivity-type and implanting ions of the second conductivity-type, ions are also implanted into at least part of the first portion to define a separation region within the first portion. The separation region splits the first portion into a first well device region and a second well device region. The separation region is formed in series between the first well device region and the second well device region.

32 Claims, 17 Drawing Sheets

U.S. PATENT DOCUMENTS

2007/0170512 A1* 7/2007 Gauthier et al. ............... 257/357
2007/0262386 A1 11/2007 Gossner et al.
2007/0267700 A1* 11/2007 Russ et al. .................... 257/355

OTHER PUBLICATIONS

Raissi, Farshid, "A Brief Analysis of the Field Effect Diode and Breakdown Transistor," IEEE Transactions on Electron Devices, vol. 43, No. 2, Feb. 1996, pp. 362-365.

Voldman, S., et al., "Electrostatic Discharge (ESD) Protection in Silicon-on-Insulator (SOI) CMOS Technology with Aluminum and Copper Interconnects in Advanced Microprocessor Semiconductor Chips," Electrical Overstress/Electrostatic Discharge Symposium Proceedings, 1999, pp. 105-115.

Tang, Howard T.-H., et al., "Novel Diode Structures and ESD Protection Circuits in a 1.8-V 0.15-μm Partially-Depleted SOI Salicided CMOS Process," IEEE, Proceedings of 8th IPFA, 2001, pp. 91-96.

Salman, Akram, et al., "Field Effect Diode (FED): A Novel Device for ESD Protection in Deep Sub-Micron SOI Technologies," IEEE, 2006, 4 pages.

"Protection Element and Method of Manufacture," U.S. Appl. No. 11/270,029, filed Nov. 8, 2005.

"Electrostatic Discharge Protection Devices and Methods for Protecting Semiconductor Devices Against Electrostatic Discharge Events," U.S. Appl. No. 11/549,923, filed Oct. 16, 2006.

PCT International Search Report for International Application No. PCT/US08/007975; Dated Sep. 1, 2008.

* cited by examiner

ELECTROSTATIC DISCHARGE PROTECTION DEVICES

FIELD

The present invention generally relates to protection of circuits from electrostatic discharge events, electrostatic discharge protection devices and methods for fabricating semiconductor devices including the same.

BACKGROUND

As semiconductor technology advances beyond 130 nm and 90 nm technology towards 65 nm, 45 nm, 32 nm, and even beyond, the electrostatic discharge (ESD) protection for input/output (I/O) pads and their local clamps and supply clamps becomes more challenging. This is especially true for silicon-on-insulator (SOI) technology, which is expected to be preferable over bulk technology.

An ESD event refers to a phenomenon of electrical discharge of a current for a short duration during which a large amount of current is provided to a semiconductor structure. During an ESD event, an ESD protection device protects the semiconductor structure. An ideal ESD protection device operates like an open circuit during normal circuit operation, but operates like a short circuit which shunts current caused by the ESD event away from the protected semiconductor structure. While this ideal behavior is not possible in practical implementations, there are ESD protection devices which closely approximate this behavior.

Present-day ESD protection devices present a number of drawbacks. For example, some ESD protection circuits are unacceptable because they suffer from high leakage current and high capacitive loading.

Accordingly, it is desirable to provide an ESD protection device that exhibits low leakage and low capacitive loading. It also is desirable to provide an ESD protection device that enables a reduction in size of the device. In addition, it is desirable to provide a method for protecting a semiconductor structure from an ESD event using an improved ESD protection device. It is also desirable to provide a method for fabricating an ESD protection device which reduces or eliminates strict fabrication constraints associated with conventional Field Effect Diode (FED) fabrication methods. Furthermore, other desirable features and characteristics of the present invention will become apparent from the subsequent detailed description of the invention and the appended claims, taken in conjunction with the accompanying drawings and this background of the invention.

SUMMARY

In accordance with an exemplary embodiment of the present invention, a device is provided. The device includes a silicon substrate, a first gate electrode and a second gate electrode. A first conductivity-type diode region is disposed within the silicon substrate. A first well device region is disposed within the silicon substrate in series with the first conductivity-type diode region. A separation region is disposed within the silicon substrate in series with the first well device region. A second well device region is disposed within the silicon substrate in series with the separation region. A second conductivity-type diode region is disposed within the silicon substrate. The second conductivity-type diode region is disposed within the silicon substrate in series with the second well device region. The first gate electrode is disposed overlying the first well device region of the silicon substrate, and the second gate electrode is disposed overlying the second well device region of the silicon substrate.

In accordance with another exemplary embodiment of the present invention, a method for fabricating a semiconductor device is provided. According to this method, a first gate electrode and a second gate electrode are formed overlying a first portion of a silicon substrate, and ions of a first conductivity-type are implanted into a second portion of the silicon substrate to define a first conductivity-type diode region within the silicon substrate. Ions of a second conductivity-type are implanted into a third portion of the silicon substrate to define a second conductivity-type diode region within the silicon substrate. During one of the steps of implanting ions of the first conductivity-type and implanting ions of the second conductivity-type, ions are also implanted into at least part of the first portion to define a separation region within the first portion. The separation region splits the first portion into a first well device region and a second well device region. The separation region is formed in series between the first well device region and the second well device region.

BRIEF DESCRIPTION OF THE DRAWINGS

The present invention will hereinafter be described in conjunction with the following drawing figures, wherein like numerals denote like elements, and wherein:

FIGS. 1-3 and 11-16 illustrate, in cross section, an ESD protection device and method steps for its fabrication in accordance with other exemplary embodiments of the invention.

DETAILED DESCRIPTION

The following detailed description is merely exemplary in nature and is not intended to limit the invention or the application and uses of the invention. The word "exemplary" is used herein to mean "serving as an example, instance, or illustration." Any embodiment described herein as "exemplary" is not necessarily to be construed as preferred or advantageous over other embodiments. All of the implementations described below are exemplary implementations provided to enable persons skilled in the art to make or use the invention and are not intended to limit the scope of the invention which is defined by the claims. Furthermore, there is no intention to be bound by any expressed or implied theory presented in the preceding technical field, background, brief summary or the following detailed description.

FIGS. 1-9 illustrate, in cross section, an ESD protection device 150 and method steps for its fabrication in accordance with various exemplary embodiments of the invention.

Figure 1:
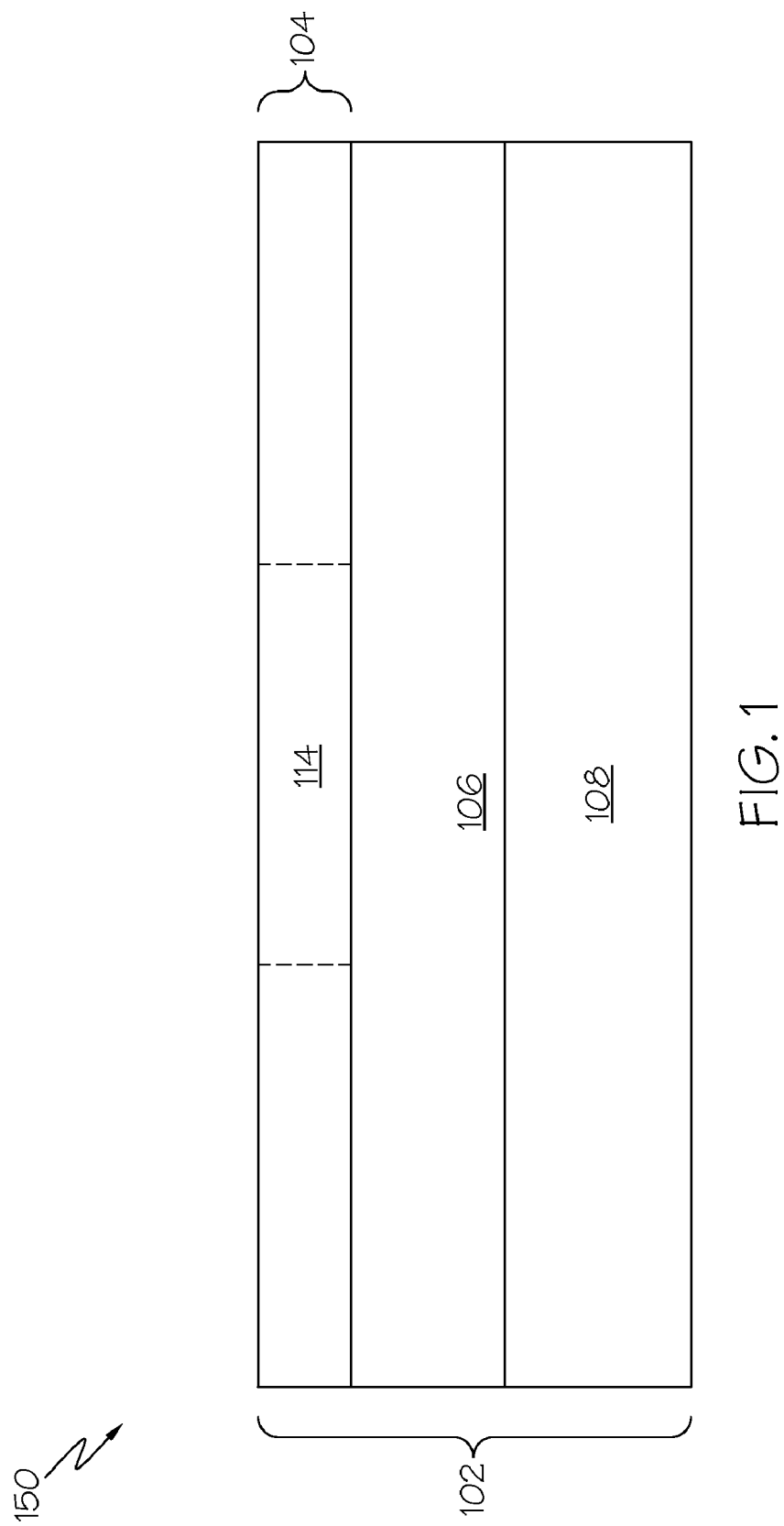
FIGS. 1-9 illustrate, in cross section, an ESD protection device and method steps for its fabrication in accordance with various exemplary embodiments of the invention.

As illustrated in FIG. 1, the manufacture in accordance with an embodiment of the invention begins with providing a semiconductor structure 102 in and on which Field Effect Diodes (FEDs) will be fabricated. The semiconductor structure 102 can be either a bulk semiconductor material or a semiconductor-on-insulator (SOI) structure 102 as illustrated in the embodiment of FIG. 1. The SOI structure 102 illustrated in FIG. 1 comprises at least one thin layer of semiconductor material 104 disposed on or overlying a buried oxide insulating layer 106 which, in turn, is supported by a carrier wafer or substrate 108 so that the buried oxide insulating layer 106 is disposed between the carrier wafer 108 and the semiconductor layer 104. The semiconductor layer 104 can be a thin silicon layer, a germanium layer, a gallium arsenide layer, or other semiconductor materials. In one embodiment, the semiconductor material layer 104 comprises a thin monocrystalline layer of silicon on the buried oxide insulating layer 106. The thin silicon layer may be a relatively pure silicon material, or a layer of silicon material doped with impurity dopant elements such as boron, phosphorus, and arsenic. In one embodiment, the buried oxide insulating layer 106 can be, for example, a silicon dioxide layer, which preferably has a thickness of about 50-200 nm. The thin silicon layer preferably has a resistivity of at least about 1-35 Ohms per square.

In one embodiment, region 114 of the semiconductor layer 104 can optionally be lightly-doped with P-type conductivity determining impurities such as boron. In an exemplary embodiment of the invention, the P-well device regions 115, 117 are doped with a suitable dopant to a concentration of about $1 \times 10^{16}$ to about $5 \times 10^{18}$ cm$^{-3}$. As described below, region 114 is eventually used to form P-well device regions 115, 117 and the doping of the P-well device regions 115, 117 determines the impedance and conductivity of a non-parasitic leakage current across the semiconductor material layer 104 of the ESD protection device 150.

Figure 2:
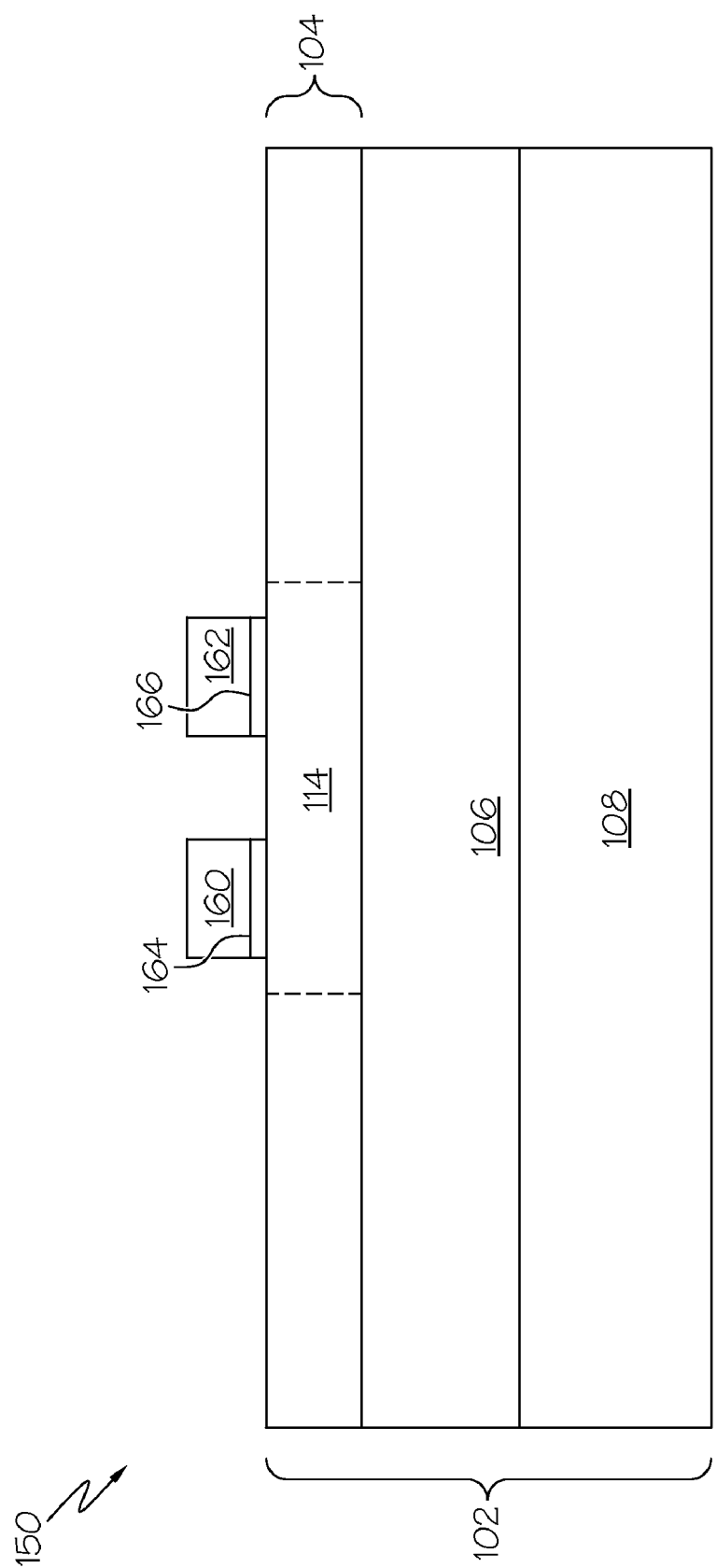

As illustrated in FIG. 2, a layer of gate insulating material 164, 166 is formed overlying semiconductor layer 104, and gate electrodes 160, 162 are formed overlying the gate insulating material 164, 166. The layer of gate insulating material 164, 166 can be a layer of thermally grown silicon dioxide or, alternatively, a deposited insulator such as silicon oxide, silicon nitride, or a high dielectric constant (κ) insulator material having a high dielectric constant (κ) relative to silicon dioxide. Examples of "high-κ dielectric" materials include hafnium and zirconium silicates, and their oxides, including, but not limited to, hafnium oxide (HfO$_2$), hafnium silicate (HfSiO), or the like. Deposited insulators can be deposited, for example, by chemical vapor deposition (CVD), low pressure chemical vapor deposition (LPCVD), plasma enhanced chemical vapor deposition (PECVD) or atomic layer deposition (ALD). The gate insulator layer 164, 166 preferably has a thickness of about 1-10 nm, although the actual thickness can be determined based on the circuit being implemented. The gate electrodes 160, 162 can be formed by depositing, patterning, and etching a layer of metal or polycrystalline silicon, preferably a layer of undoped polycrystalline silicon. The polycrystalline silicon can be deposited, for example, by the reduction of silane (SiH$_4$) in a CVD reaction such as a low pressure chemical vapor deposition (LPCVD).

Figure 3:
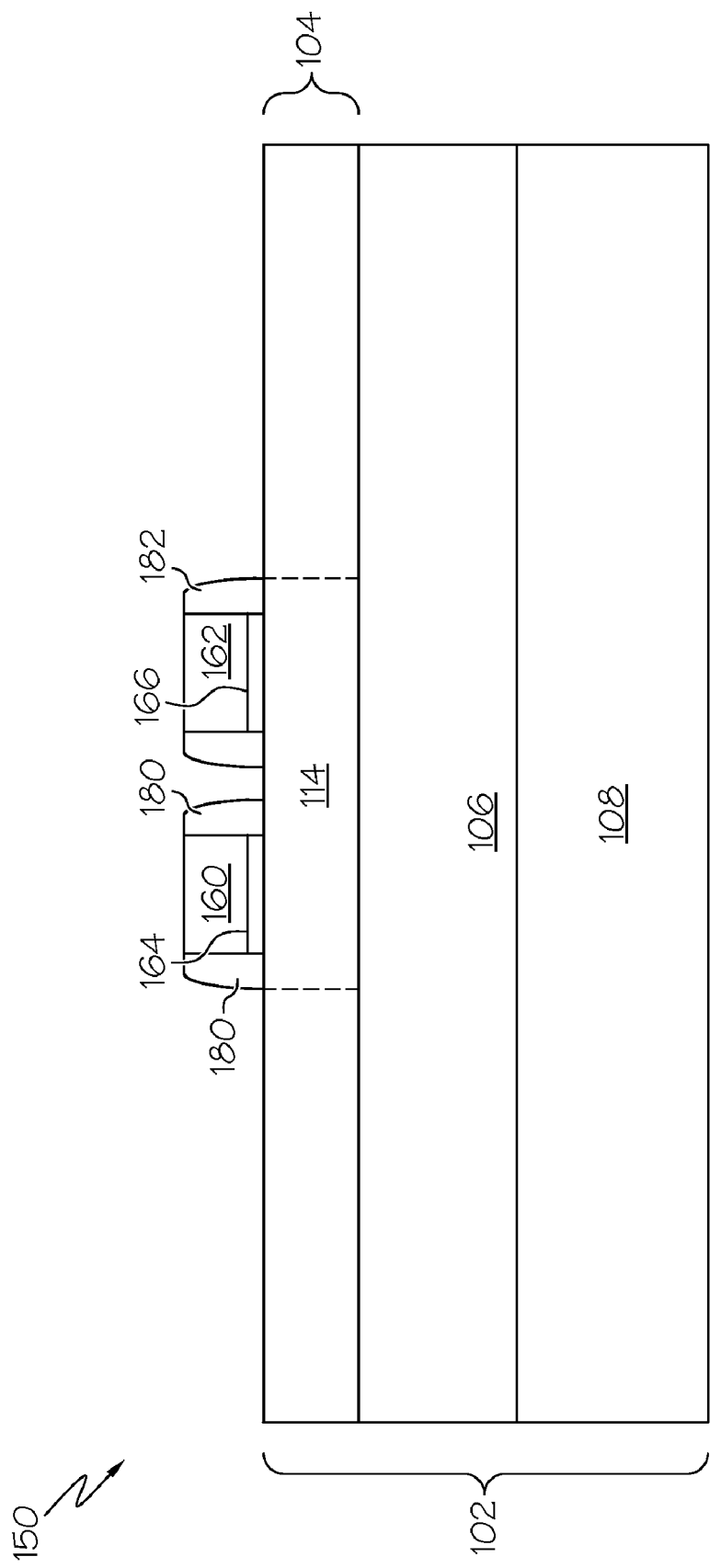

After the gate electrodes 160, 162 have been formed, sidewall spacers 180, 182 are formed on the sidewalls of the gate electrodes 160, 162 as illustrated in FIG. 3. The sidewall spacers 180, 182 are formed by depositing a layer of insulating material such as silicon oxide and/or silicon nitride and subsequently anisotropically etching the insulating layer, for example by reactive ion etching (RIE). Silicon oxide and silicon nitride can be etched, for example, in a CHF$_3$, CF$_4$, or SF$_6$ chemistry. Portions or regions of the semiconductor layer 104 are covered by the gate structures 160, 164, 180 and 162, 166, 182 so that those regions will remain as the P-type semiconductor material 114.

Figure 4:
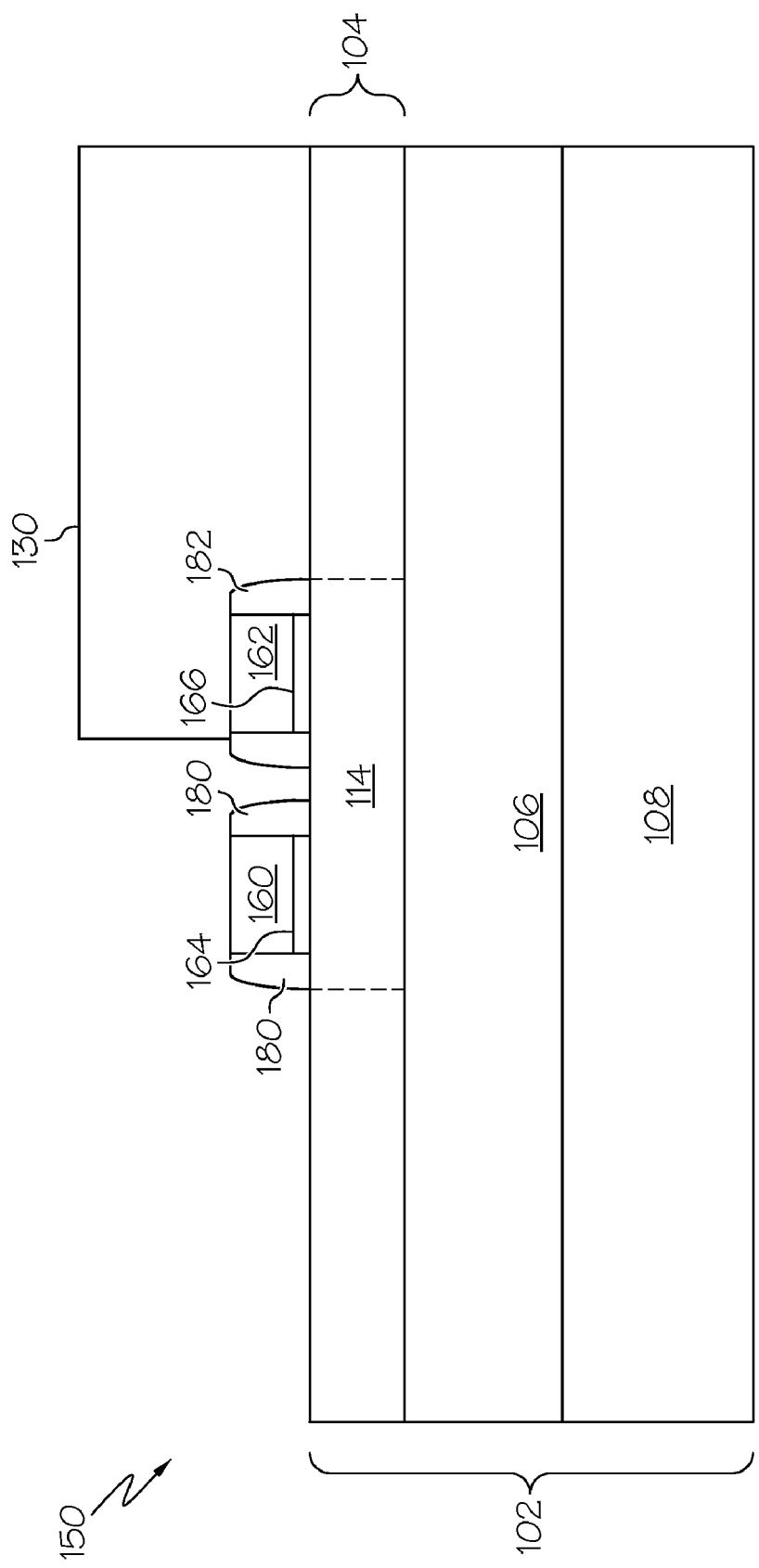

As illustrated in FIG. 4, layer of masking material, which can be, for example, a layer of photoresist, is applied and patterned to expose portions of semiconductor layer 104 and to cover other portions of the semiconductor layer 104. In this embodiment, the layer of patterned mask material 130 overlies the second gate structure 162, 166, 182 and a first portion of the substrate that is eventually used to create N$^+$-type cathode region 118.

Figure 5:
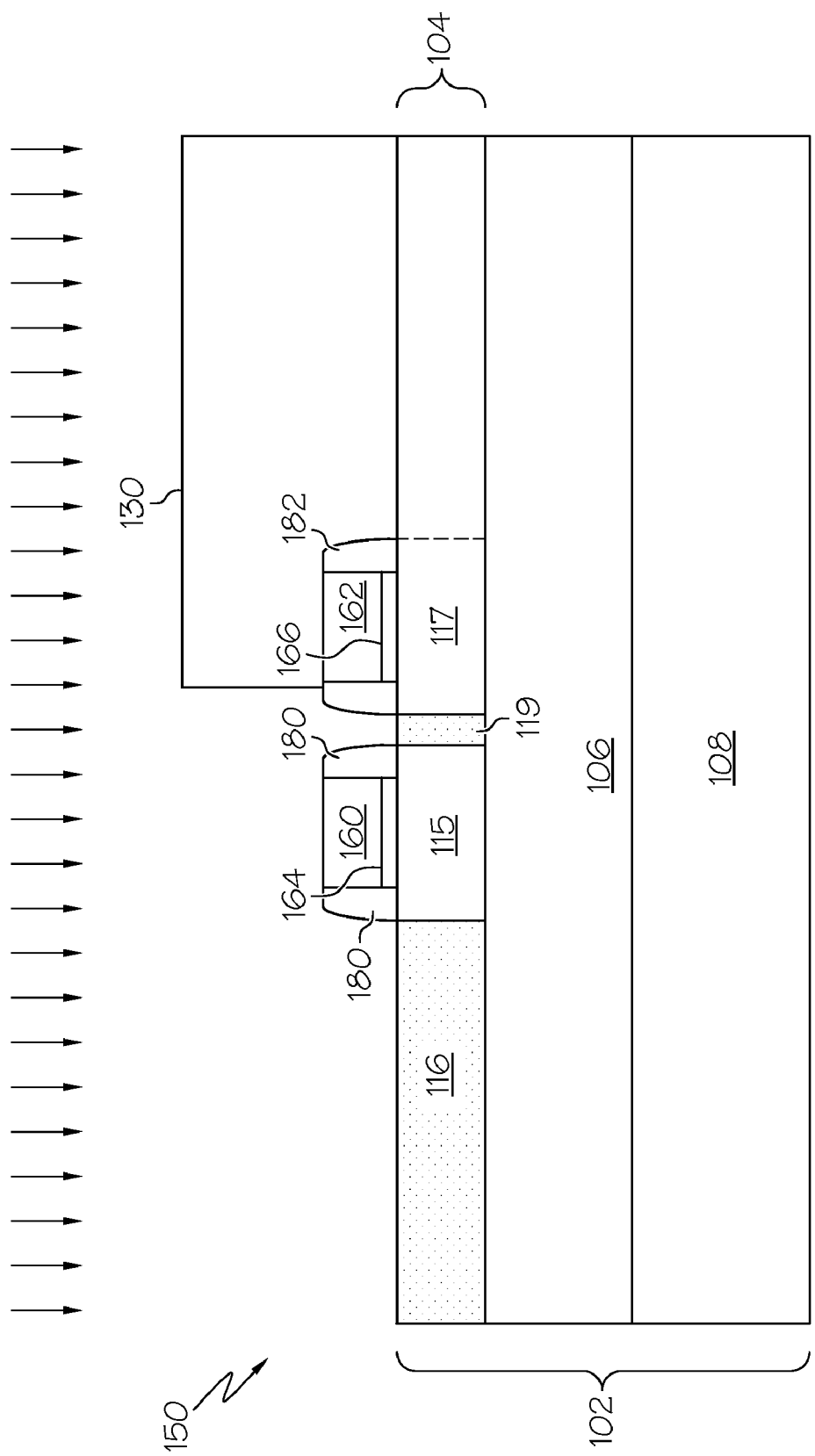

Using this layer of patterned mask material 130 as an ion implantation mask, the exposed portions of the semiconductor layer 104 are impurity doped, as illustrated by arrows, with P-type conductivity determining impurities to create a highly-doped P$^+$-type anode region 116 and a highly-doped P$^+$-type separation region 119, as illustrated in FIG. 5. The highly-doped P$^+$-type separation region 119 is formed in a portion of the P-well device region 114 that is between the gate electrodes 160, 162. In one embodiment, the P$^+$-type separation region 119 extends through P-well device region 114 to the buried oxide layer 106. By creating the highly-doped P$^+$-type separation region 119, the P-well device region 114 is split into a first P-well device region 115 and a second P-well device region 117. Impurity doping can take place by the implantation and (optionally) subsequent thermal annealing of dopant ions such as boron. The P$^+$-type regions are regions having a doping concentration greater than the doping concentration of the P-well device regions 115, 117. In an exemplary embodiment of the invention, the P$^+$-type anode region and P$^+$-type separation region 119 are doped with a suitable dopant to a concentration of about $10^{20}$ to about $10^{21}$ cm$^{-3}$.

The highly-doped P$^+$-type separation region 119 acts as a barrier which separates P-well device region 115 from P-well device region 117 and helps prevent the bias voltage (that is applied to gate electrodes 160, 162) from influencing the regions under the other gate electrodes 160, 162. This configuration allows the bias voltage applied to the gate electrodes 160, 162 to control the relative conductivity of the device regions 115, 117 without significantly influencing the conductivity of the highly-doped P$^+$-type separation region 119. The higher the P+ doping of separation region 119, the more resistant the highly-doped P$^+$-type separation region 119 is to inversion when a bias voltage is applied to gate electrodes 160, 162 (i.e., it becomes more difficult to invert highly-doped P$^+$-type separation region 119).

Figure 6:
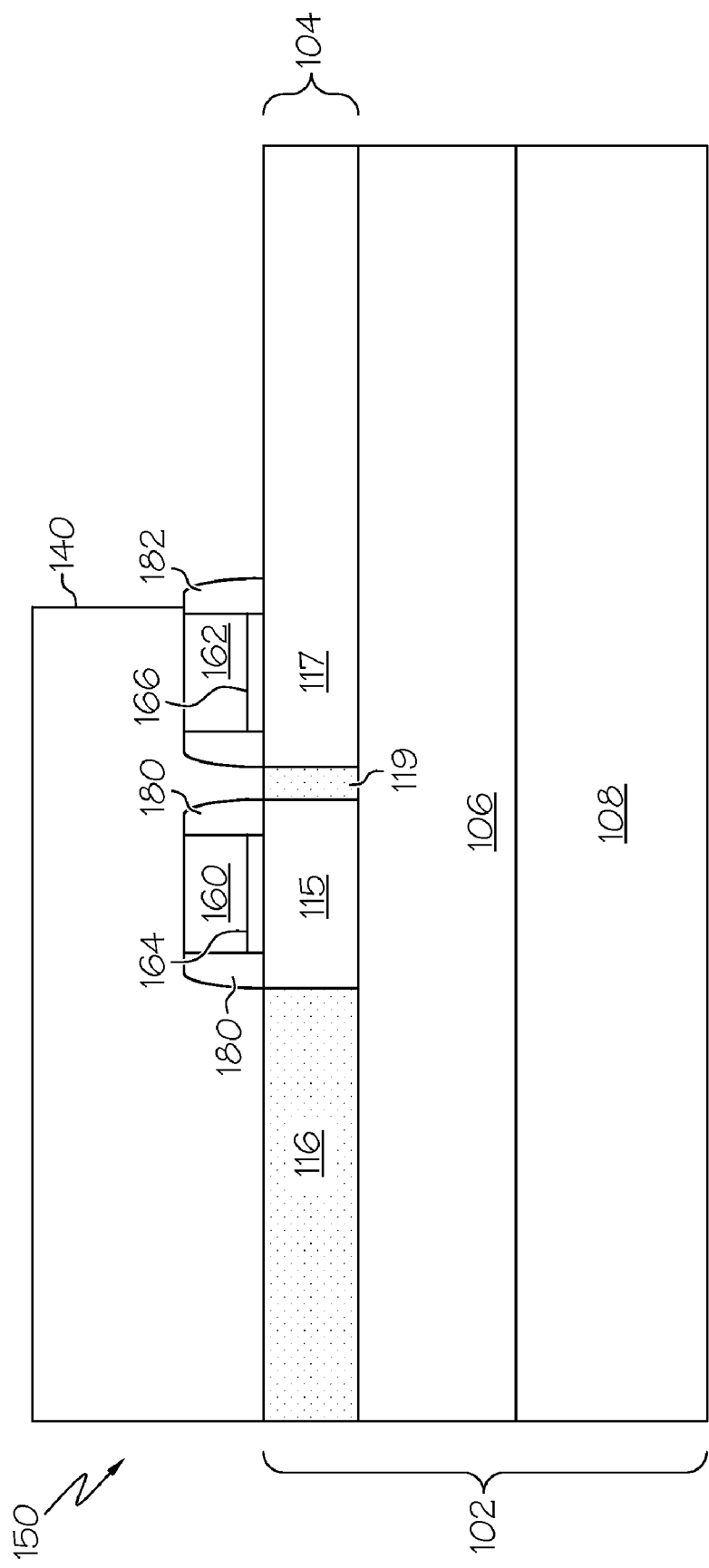

Although not shown, after implanting P-type conductivity determining impurities, the patterned mask material 130 is removed. As illustrated in FIG. 6, another layer of masking material 140, which can be, for example, a layer of photoresist, is applied and patterned to expose portions of semiconductor layer 104 and to cover other portions of the semiconductor layer 104. In this embodiment, the layer of patterned mask material 140 overlies the first gate structure 160, 164, 180, at least a portion of the second gate structure 162, 166, 182, anode region 116 and separation region 119 so that the doping of anode region 116 and separation region 119 are not altered by subsequent implantation steps.

Figure 7:
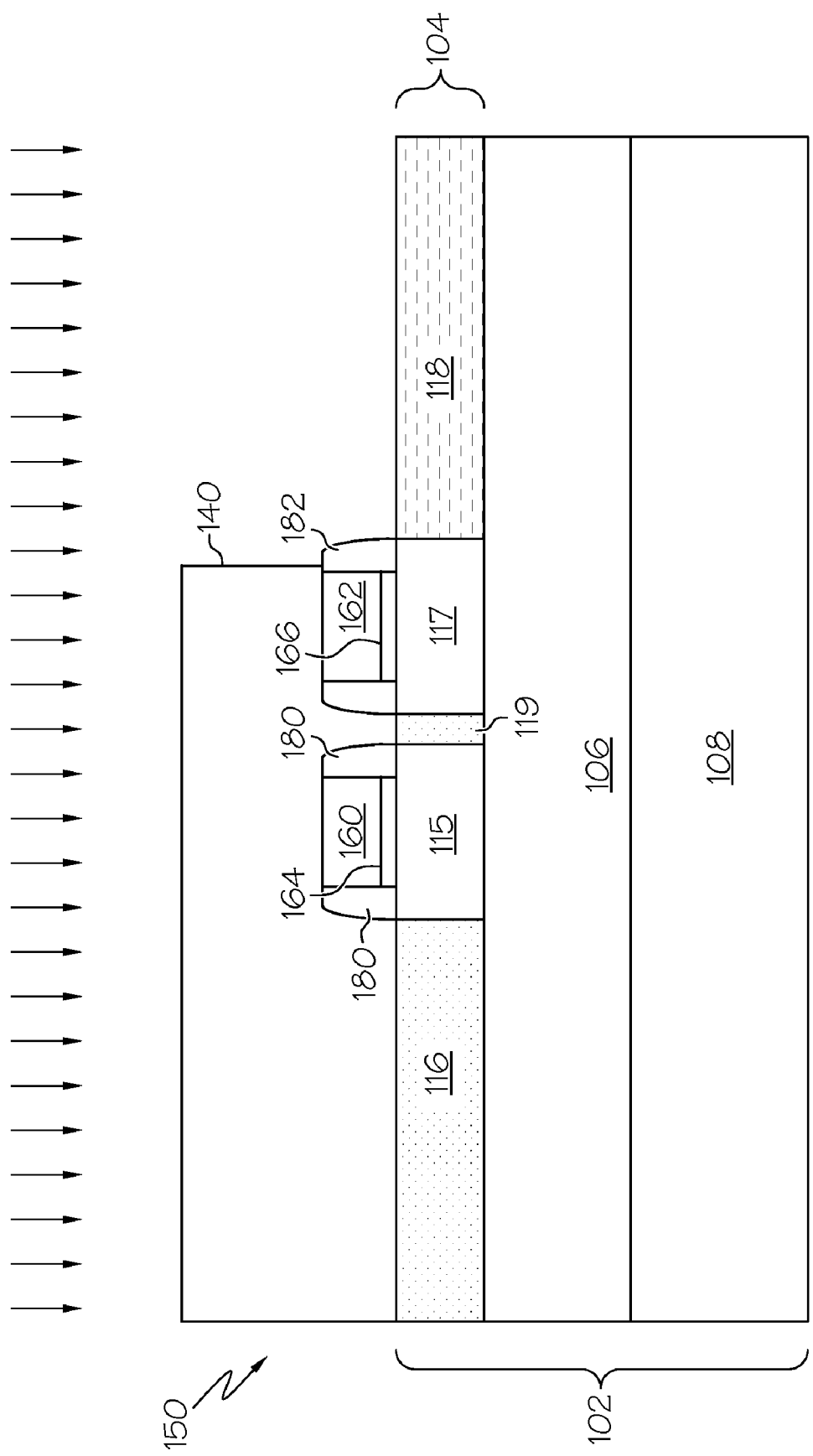

As illustrated in FIG. 7, using this layer of patterned mask material 140 as an ion implantation mask, the semiconductor layer 104 can be impurity doped, as indicated by arrows, with N-type conductivity determining impurities to create N$^+$-type cathode region 118. Impurity doping can take place by the implantation and (optionally) subsequent thermal annealing of dopant ions such as phosphorus and/or arsenic. The N$^+$-type region has a doping concentration greater than the doping concentration of the P-well device regions 115, 117. In an exemplary embodiment of the invention, the N$^+$-type cathode region may be doped with a suitable dopant to a concentration of about $10^{20}$ to about $10^{21}$ cm$^{-1}$.

Figure 8:
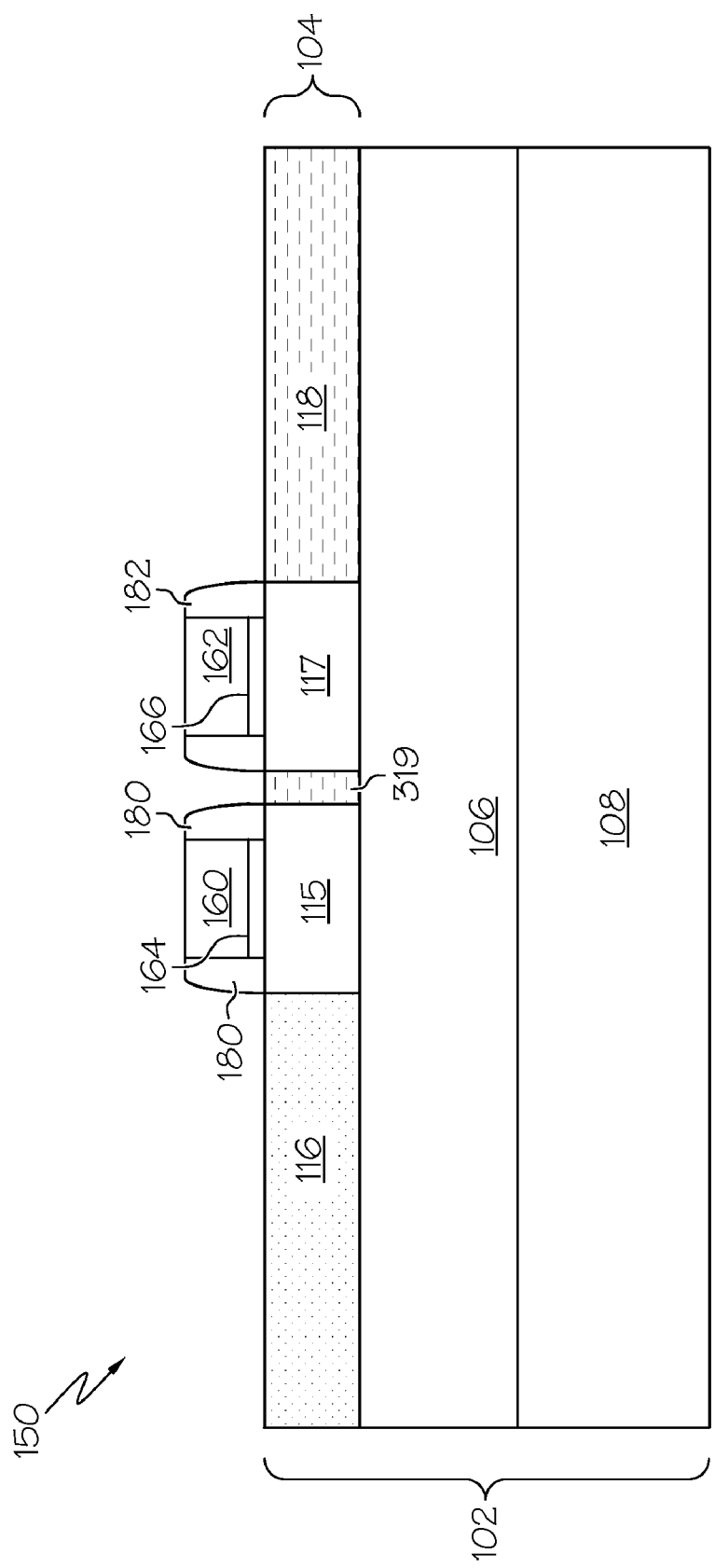

As illustrated in FIG. 8, after implanting N-type conductivity determining impurities, the patterned mask material 140 is removed. The resulting structure 150 in FIG. 8 can then (optionally) be annealed, for instance using a Rapid Thermal Annealing (RTA) process to cause outward lateral diffusion of dopants in the highly-doped P+-type anode region 116, the highly-doped P+-type separation region 119 and the N+-type cathode region 118, as illustrated in FIG. 9.

Figure 9:
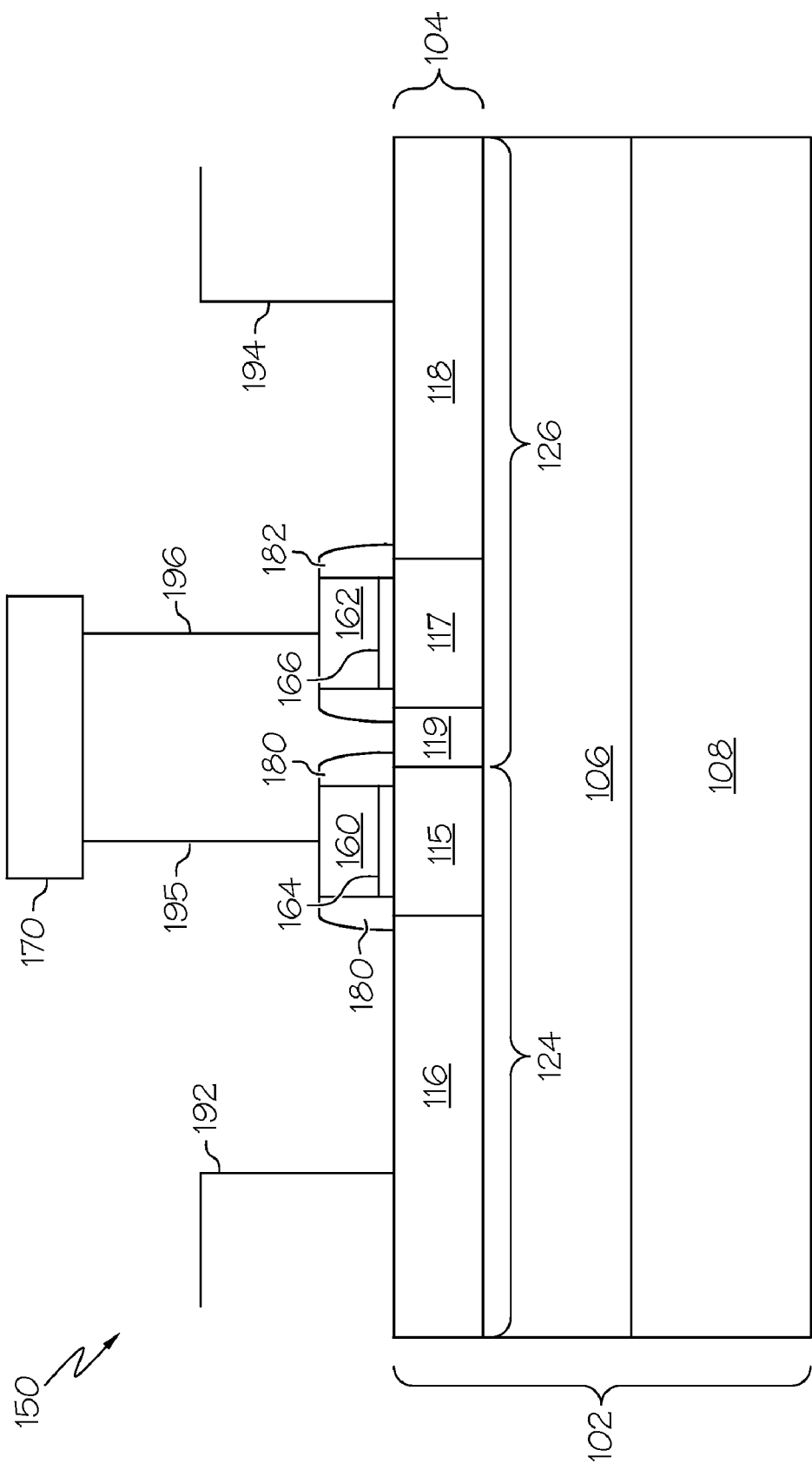

At the stage of processing shown in FIG. 9, the semiconductor substrate 104 includes a P+-type anode region 116, an $N^{30}$-type cathode region 118, and a pair of field effect diodes (FEDs) which are separated from each other via highly-doped P+-type separation region 119. The P+-type anode region 116 of semiconductor layer 104 is separated from the N+-type cathode region 118 by the first P-well device region 115, the highly-doped P+-type separation region 119 and the second P-well device region 117. Each FED includes a gate electrode structure formed over a P-well device region 115, 117, where each of the gate electrode structures comprises a gate insulator layer 164, 166, a gate electrode 160, 162 overlying the gate insulator layer 164, 166, and spacers 180, 182 adjacent a first sidewall and a second sidewall of the gate electrode 160, 162.

Although not illustrated, the device 150 can be completed, for example, by forming metal silicide contacts on the P+-type anode region 116, gate electrodes 160, 162, and N+-type cathode region 118, depositing interlayer dielectric layers, planarizing the interlayer dielectric layers, and etching contact vias or openings through the dielectric layer to the metal silicide contacts on the P+-type anode region 116, gate electrodes 160, 162, and N+-type cathode region 118. Electrical contact to the P+-type anode region 116, gate electrodes 160, 162, and N+-type cathode region 118 can then be made by contact plugs formed in contact openings and by interconnect metal deposition and patterning. In FIG. 9, the contact plugs are represented by reference numerals 192, 194-196. The contact plugs 195, 196 can eventually be connected to a bias circuit 170 which controls operation of the device 150 during different modes of operation (i.e., ESD operation versus non-ESD operation).

The bias circuit 170 operates to control a bias voltage applied to gate electrodes 160, 162. The bias voltage which the bias circuit 170 applies to the gate electrodes 160, 162 depends on the operating state of the circuit the ESD protection device 150 is protecting from an ESD event. Depending upon how the gate electrodes 160, 162 are biased, the semiconductor layer 104 of the ESD protection device 150 exhibits different arrangements of P-N junctions. The ESD protection device 150 is a normally-on enhanced field effect diode (FED) meaning that during normal operation, the ESD protection device 150 operates in a biased state, and that during an ESD event biasing stops to protect a core circuit (not shown) against an ESD event. Table 1 summarizes operation of the ESD protection device 150 during its different operating modes.

TABLE 1

| OPER-<br>ATING<br>MODE | SUBSTRATE REGIONS | | | | | RESULT |
|---|---|---|---|---|---|---|
| | 116 | 115 | 119 | 117 | 118 | |
| ESD | P+ | P | P+ | P | N+ | DIODE |
| NORMAL | P+ | N<br>(INVERTS) | P+ | N<br>(INVERTS) | N+ | SERIES<br>DIODES |

During normal circuit operation or "non-ESD operation" when there is not an ESD event, the bias circuit 170 applies a high positive bias voltage to both gate electrodes 160, 162 which initially causes depletion in the P-well device regions 115, 117 underneath gate electrodes 160, 162 and as the high bias voltage increases eventually inverts the surface conductivity of the P-well device regions 115, 117 so that the P-well device regions 115, 117 behave like N-type material. This results in a series P+ N P+ N N+ profile across and within semiconductor layer 104. One PN junction is formed between P−-type anode region 116 and device region 115, another PN junction is formed between device region 115 and highly-doped P+-type separation region 119, while another PN junction is formed between device region 117 and highly-doped P+-type separation region 119. ESD protection device 150 is configured such that P+-type anode region 116 is positively biased with respect to N+-type cathode region 118. As such, the semiconductor layer 104 is essentially configured like a forward-biased diode 124 in series with another forward-biased diode 126, and the semiconductor layer 104 operates like a PNPN (SCR) structure where its turn-on voltage is dependent on an energy barrier height of the central reverse bias PN junction formed between device region 115 and highly-doped P+-type separation region 119. Because the ESD protection device 150 operates like two diodes in series (or alternatively as a PNPN SCR structure) during normal operation, the ESD protection device 150 has a relatively high impedance and is resistant to conduction of a non-parasitic leakage current across the semiconductor material layer 104 of the ESD protection device 150. The ESD protection device 150 begins to conduct only when the voltage applied across the diodes 124, 126 is greater than 1.4 volts (0.7 volts attributable to each of the diodes 124, 126).

Because the ESD protection device 150 has two PN junctions in series, the total capacitance of the ESD protection device 150 is reduced since the total capacitance of two diodes in series is lower than each of them individually. Because RF I/O circuits are sensitive to ESD loading capacitance, the low capacitance of the series diodes under normal operation allows the ESD protection device 150 to be used in high speed or RF I/O pads as well as for low leakage/low power pads. During normal operation, the relatively high impedance of ESD protection device 150 causes the ESD protection device 150 to effectively behave like an open circuit with respect to the core circuit being protected.

By contrast, when an ESD event occurs, the bias circuit 170 stops applying the high bias voltage so that the gate electrodes 160, 162 are left in their unbiased or "electrically floating." This causes the surface of well device regions 115, 117 under gate electrodes 160, 162 to return or revert to P-type which results in a series P+ P P+ P N+ profile across semiconductor layer 104 (i.e., semiconductor layer 104 has one PN junction between P+-type anode region 116 and the N-type cathode region 118 at the junction between P-well device region 117 and N+-type cathode region 118). Therefore, during an ESD event, the ESD protection device 150 behaves as a single forward-biased diode and the on-voltage of ESD protection device 150 is reduced to about 0.7 volts. Accordingly, during an ESD event, the ESD protection device 150 has relatively low impedance and allows conduction of a current across the semiconductor material layer 104 of the ESD protection device 150. As will be described below, the ESD protection device 150 effectively operates like a short circuit which shorts the current resulting from the ESD event to ground thereby protecting the core circuit.

The device 150 illustrated in FIG. 9 can be fabricated in an alternative complementary conductivity-type embodiment, where at least a portion of the starting substrate is lightly-doped with N-type conductivity determining impurities such as phosphorous or arsenic and is therefore an N-type substrate 104. In this embodiment, the well device regions 115, 117 are N-well device regions 115, 117, and the separation region 119 is doped with N-type impurities to form a highly-doped N+-type separation region 119. ESD protection device 150 is configured such that P+-type anode region 116 is positively biased with respect to N+-type cathode region 118. Table 2 illustrates operation of the normally-on FED 150 when the substrate 104 is an N-type substrate 104, regions 115, 117 are N-type material and the separation region 119 is N+-type material.

TABLE 2

| OPER-ATING MODE | SUBSTRATE REGIONS | | | | RESULT |
|---|---|---|---|---|---|
| | 116 | 115 | 119 | 117 | 118 | |
| ESD | P+ | N | N+ | N | N+ | DIODE |
| NORMAL | P+ | P (INVERTS) | N+ | P (INVERTS) | N+ | SERIES DIODES |

During normal circuit operation, the bias circuit 170 applies a high negative bias voltage to both gate electrodes 160, 162 which initially causes depletion in the N-well device regions 115, 117 underneath gate electrodes 160, 162 and as the high bias voltage increases eventually inverts the surface conductivity of the N-well device regions 115, 117 so that the N-well device regions 115, 117 behave like P-type material. This results in a series P+ P N+ P N+ profile across semiconductor layer 104. One PN junction is formed between device region 115 and highly-doped N+-type separation region 119, another PN junction is formed between highly-doped N+-type separation region 119 and device region 117 while another PN junction is formed between device region 117 and cathode region 118. As such, during normal operation, the semiconductor layer 104 is configured like two forward-biased diodes in series, and the ESD protection device 150 has a relatively high impedance which makes the ESD protection device 150 more resistant to conduction of a current across the semiconductor material layer 104 of the ESD protection device 150. As such, the ESD protection device 150 effectively behaves like an open circuit with respect to the core circuit being protected.

By contrast, when an ESD event occurs, the bias circuit 170 stops applying the high bias voltage so that the gate electrodes 160, 162 are left in their unbiased or "electrically floating." This causes the well device regions 115, 117 under gate electrodes 160, 162 to return or revert to N-type which results in a series P+ N N+ N N+ profile across and within semiconductor layer 104 (i.e., semiconductor layer 104 has one PN junction between P+-type anode region 116 and N-well device region 115). Therefore, during an ESD event, the ESD protection device 150 behaves as a single forward-biased diode and the on-voltage of ESD protection device 150 is reduced to about 0.7 volts. Accordingly, during an ESD event, the ESD protection device 150 has relatively low impedance and allows conduction of a current across the semiconductor material layer 104 of the ESD protection device 150. As such, the ESD protection device 150 effectively operates as a short circuit, which shorts the current resulting from the ESD event to ground thereby protecting the core circuit.

One implementation of the ESD protection device 150 used as a local clamping circuit will be discussed below with respect to FIG. 10.

Figure 10:
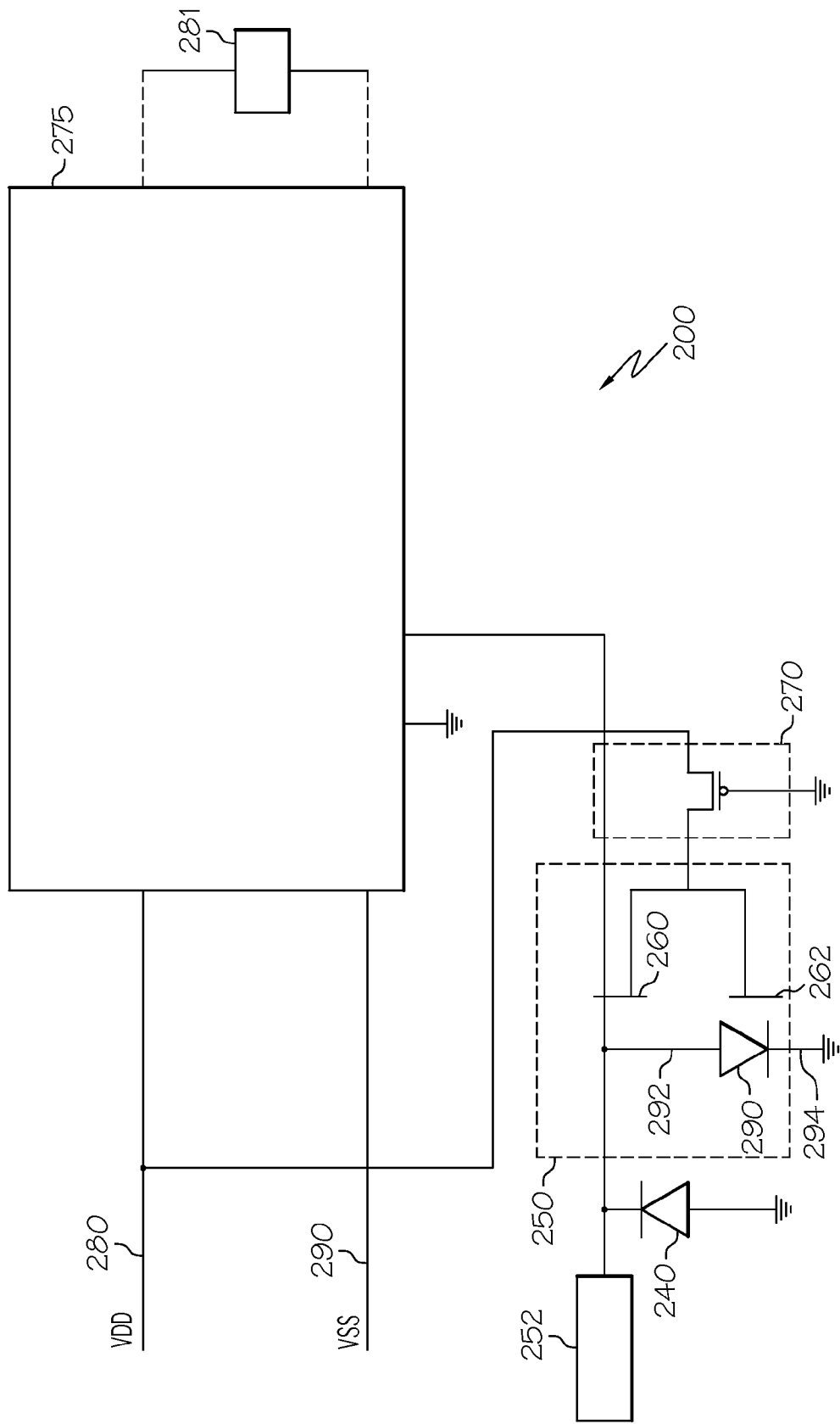
FIG. 10 is a schematic circuit diagram of an input/output (I/O) circuit which implements the ESD protection device of FIG. 9.

FIG. 10 is a schematic circuit diagram of an input/output (I/O) circuit 200 which implements the ESD protection device 250. The ESD protection device 250 is identical to the ESD protection device 150 in FIG. 9. The I/O circuit 200 includes an I/O pad 252, an ESD diode 240, an ESD protection device 250, a bias circuit 270, a positive (VDD) supply rail 280, a negative (VSS) supply rail 290, a circuit 275 to be protected from an ESD event, and a supply clamp 281.

In this embodiment, ESD protection device 250 is implemented as a local clamping circuit to provide local clamping of an ESD current to reduce the voltage on the I/O pad 252. Local clamping means the ESD current is shunted to ground at the I/O pad 252. In other words, rail-based clamping is not needed and there is no need to pass the ESD current through the supply rails 280, 290 to the supply clamp 281 and back to ground. In this case, the ESD protection device 250 can provide adequate protection without increasing the I/O pad 252 clamping voltage, and can therefore be implemented in a smaller area in comparison to standard ESD protection devices. To explain further, during an ESD event, the ESD voltage at I/O pad 252 to ground is determined by the resistance of the elements in the path of the ESD current. With local clamping, the ESD voltage is determined only by the resistance of the ESD protection device 250 which is proportional to its width. By contrast, in a rail based clamping scheme, the ESD voltage is determined by the sum of the voltage drop across the diode to the supply rail 280 and the resistance of the supply rail 280 to the supply clamp 281 and the resistance of the supply clamp 281 to ground. To achieve the same voltage at I/O pad 252 for both cases, the ESD protection device in a rail based clamping scheme has to be wider than with local clamping to compensate for the extra resistance in the path.

As described above, the ESD protection device 250 exhibits different behaviors based on whether the circuit is operating normally or if there is an ESD event. When the circuit is operating normally, the bias circuit 270, which is a PMOSFET in this embodiment, applies a high bias voltage to the gates 260, 262 of the ESD protection device 250. Thus, during normal operation, the ESD protection device 250 operates like two diodes in series which have relatively high impedance and which are resistant to conduction of a current across the semiconductor material layer 104 of the ESD protection device 150. Therefore the ESD protection device 250 does not begin conducting during normal circuit operation (i.e., appears as an open circuit). During a positive ESD event a large voltage is applied to I/O pad 252 which causes a large current to flow. The large voltage causes the ESD protection device 250 to operate in its unbiased state in which the gates 260, 262 of the ESD protection device 250 are not biased (i.e., the gates 260, 262 of the ESD protection device 250 are essentially floating or grounded). Accordingly, as described above, the ESD protection device 250 operates like a single forward-biased diode with relatively low impedance which makes it relatively easy to cause conduction of a current across the semiconductor material layer 104 of the ESD protection device 250. The current caused by the ESD event flows through from the anode 292 of the diode to the cathode 294 of the diode to ground.

The ESD diode 240 can be used to provide ESD protection during an opposite polarity situation (i.e., a negative ESD event) where voltage on I/O pad 252 is pulled below ground which forward biases ESD diode 240. In this situation, the ESD protection device 250 is reverse biased and does nothing.

Although not shown, the ESD protection device 250 can also be implemented within the supply clamp 281 for high voltage supplies. Because the ESD protection device 250 operates as a single forward-biased diode during ESD operation, using the ESD protection device 250 in the supply clamp 281 allows at least one diode to be eliminated in supply clamp 281, thus reducing the area of the supply clamp by 25% to 50%. Moreover, because supply clamp 281 can be implemented using fewer diodes, the voltage drop across the supply clamp 281 during ESD operation is lower or reduced in comparison to conventional supply clamps.

FIGS. 1-3 and 11-16 illustrate, in cross section, an ESD protection device 350 and method steps for its fabrication in accordance with other exemplary embodiments of the invention.

Figure 11:
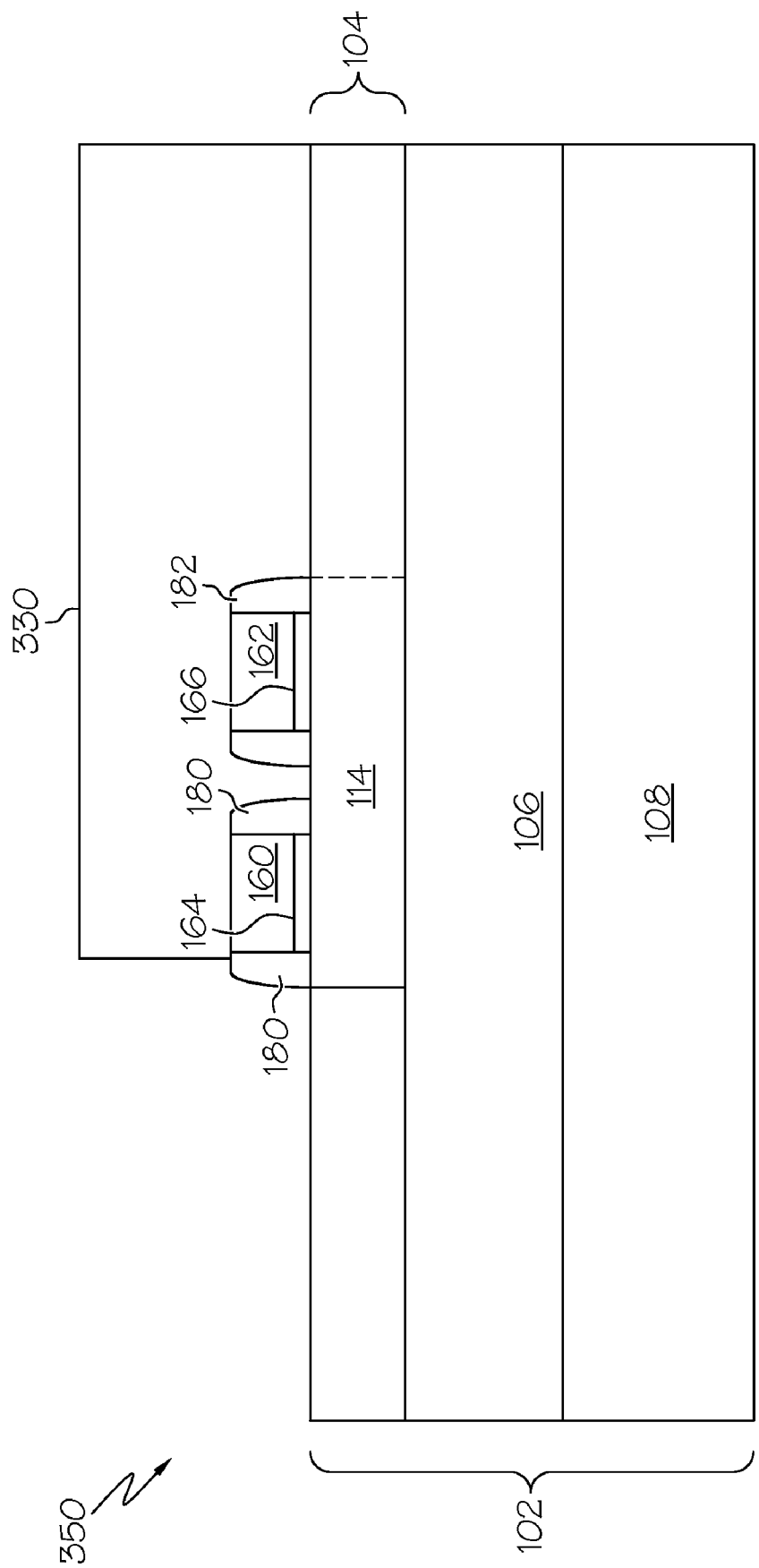

FIGS. 1-3 are described above, and for sake of brevity, will not be reiterated here. As illustrated in FIG. 11, a layer of masking material 330, which can be, for example, a layer of photoresist, is applied and patterned to expose portions of semiconductor layer 104 and to cover other portions of the semiconductor layer 104. In this embodiment, the layer of patterned mask material 330 overlies at least a portion of the first gate structure 160, 164, 180, the second gate structure 162, 166, 182 and a first portion of the substrate that is eventually used to create N+-type cathode region 318.

Figure 12:
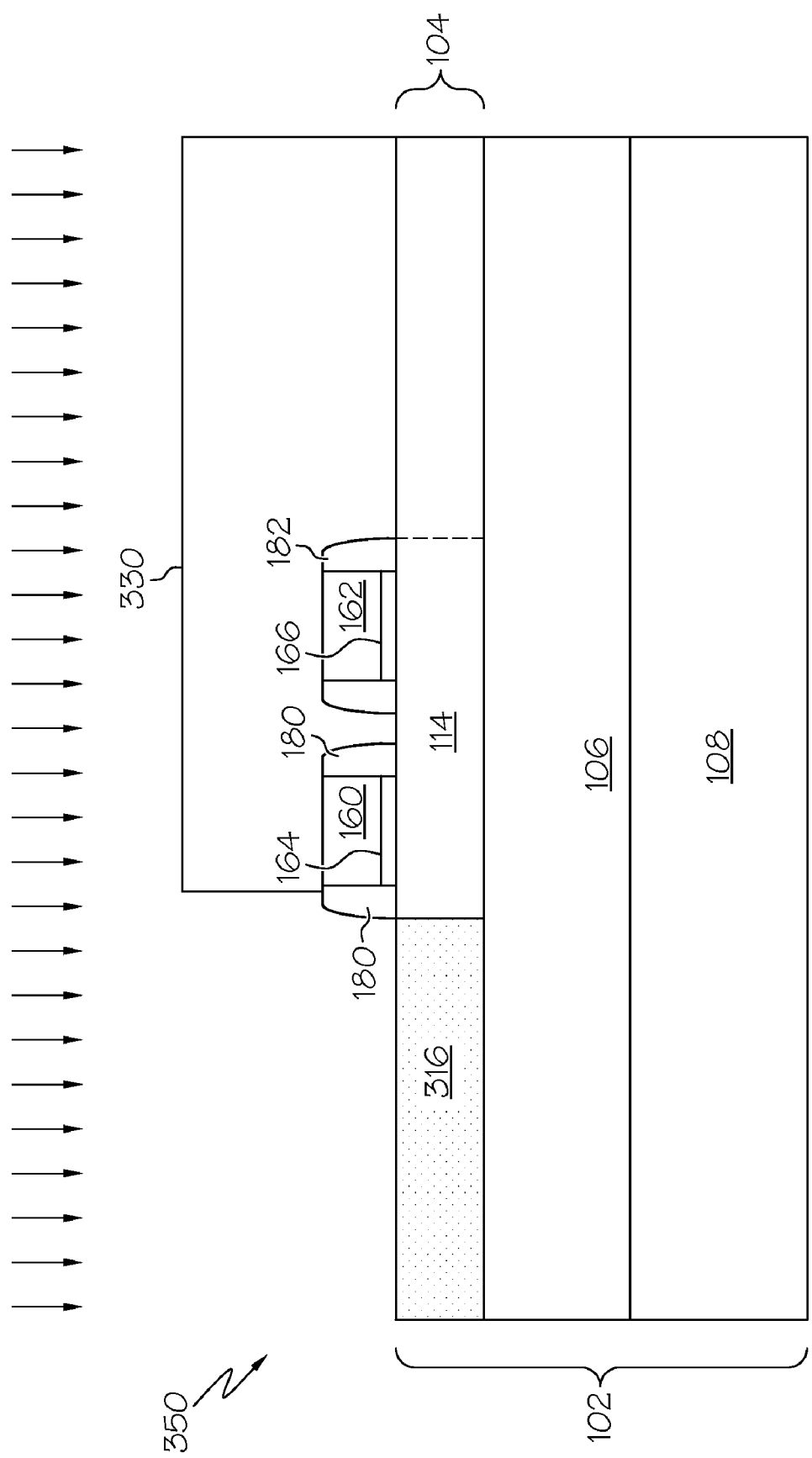

Using this layer of patterned mask material 330 as an ion implantation mask, the exposed portions of the semiconductor layer 104 can be impurity doped with P-type conductivity determining impurities to create a highly-doped P+-type anode region 316, as illustrated in FIG. 12. In an exemplary embodiment of the invention, impurity doping can take place as described above with respect to FIG. 5.

Figure 13:
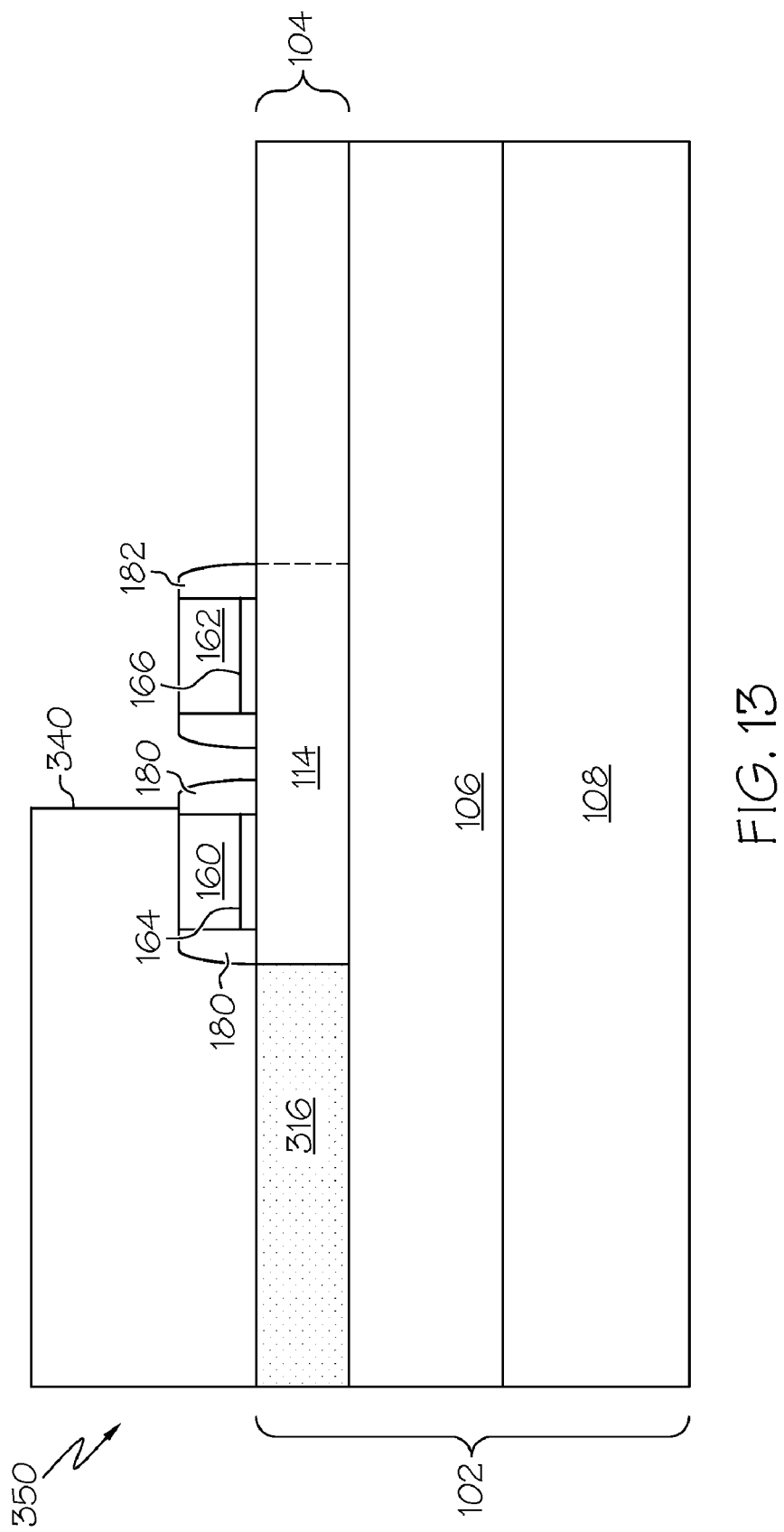

After implanting P-type conductivity determining impurities, the patterned mask material 330 is removed, and another layer of masking material 340, which can be, for example, a layer of photoresist, is applied and patterned to expose portions of semiconductor layer 104 and to cover other portions of the semiconductor layer 104, as illustrated in FIG. 13. In this embodiment, the layer of patterned mask material 340 overlies at least a portion of the first gate structure 160, 164, 180 and the highly-doped P+-type anode region 316 so that the doping of highly-doped P+-type anode region 316 is not altered during subsequent implantation steps.

Figure 14:
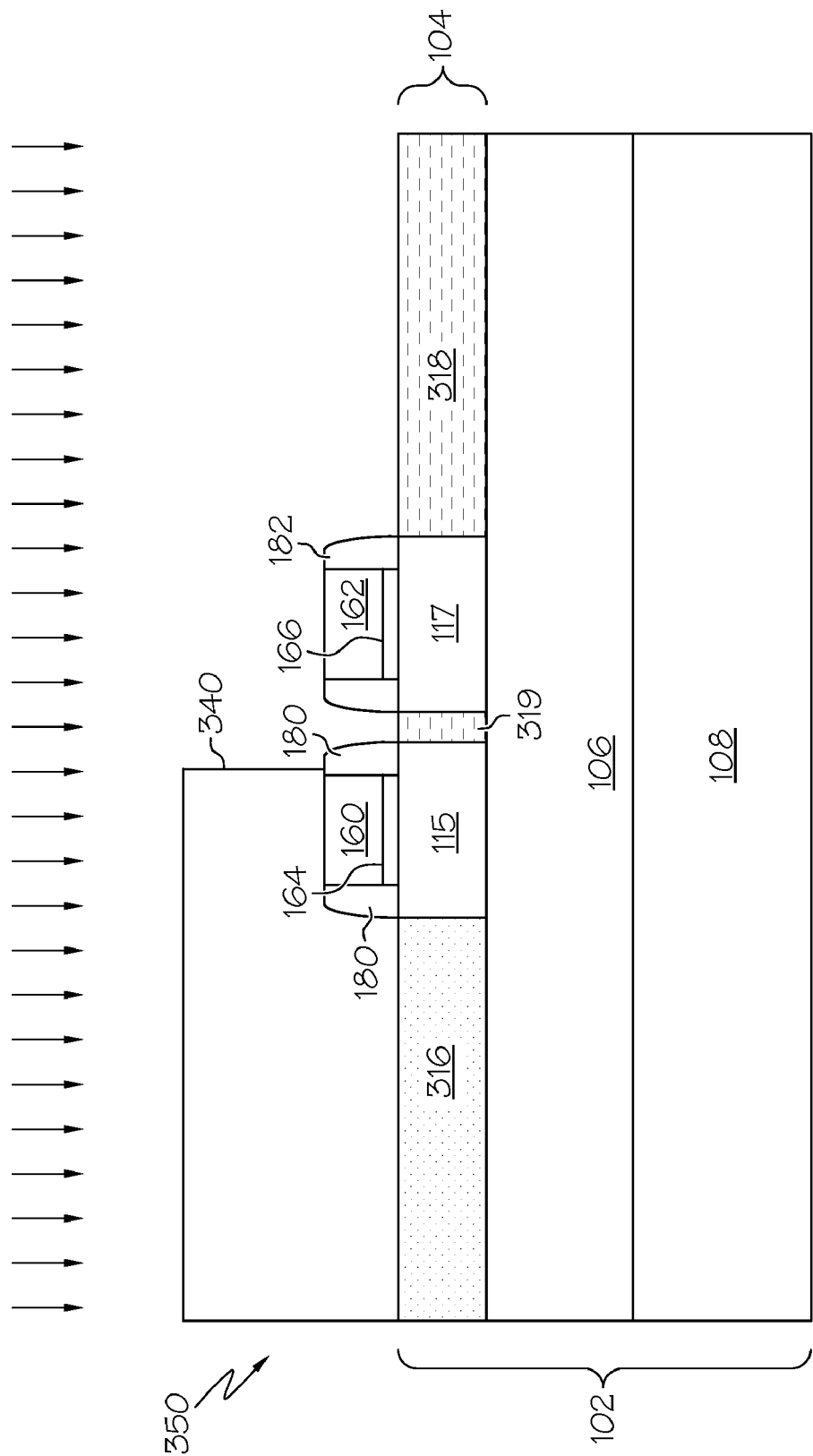

Using this layer of patterned mask material 340 as an ion implantation mask, the exposed portions of the semiconductor layer 104 are impurity doped with N-type conductivity determining impurities to create a highly-doped N+-type cathode region 318 and a highly-doped N+-type separation region 319, as illustrated in FIG. 14. In an exemplary embodiment of the invention, impurity doping can take place by the implantation as described above with respect to FIG. 7. The highly-doped N+-type separation region 319 is formed in a portion of the P-well device region 114 that is between the gate electrodes 160, 162. By creating the highly-doped N+-type separation region 319, the P-well device region 114 is split into a first P-well device region 115 and a second P-well device region 117. In one embodiment, the N+-type separation region 319 extends through P-well device region 114 to the buried oxide layer 106. The highly-doped N+-type separation region 319 acts as a barrier which separates P-well device region 115 from P-well device region 117 and helps prevent the bias voltage (that is applied to gate electrodes 160, 162) from influencing the regions under the other gate electrodes 160, 162. This configuration allows the bias voltage applied to the gate electrodes 160, 162 to control the relative conductivity of the device regions 115, 117 without significantly influencing the conductivity of the highly-doped N+-type separation region 319. The higher the N+ doping of separation region 319, the more resistant the separation region 319 is to inversion when a bias voltage is applied to the gate electrodes 160, 162 (i.e., makes it more difficult to invert the highly-doped N+-type separation region 319).

Figure 15:
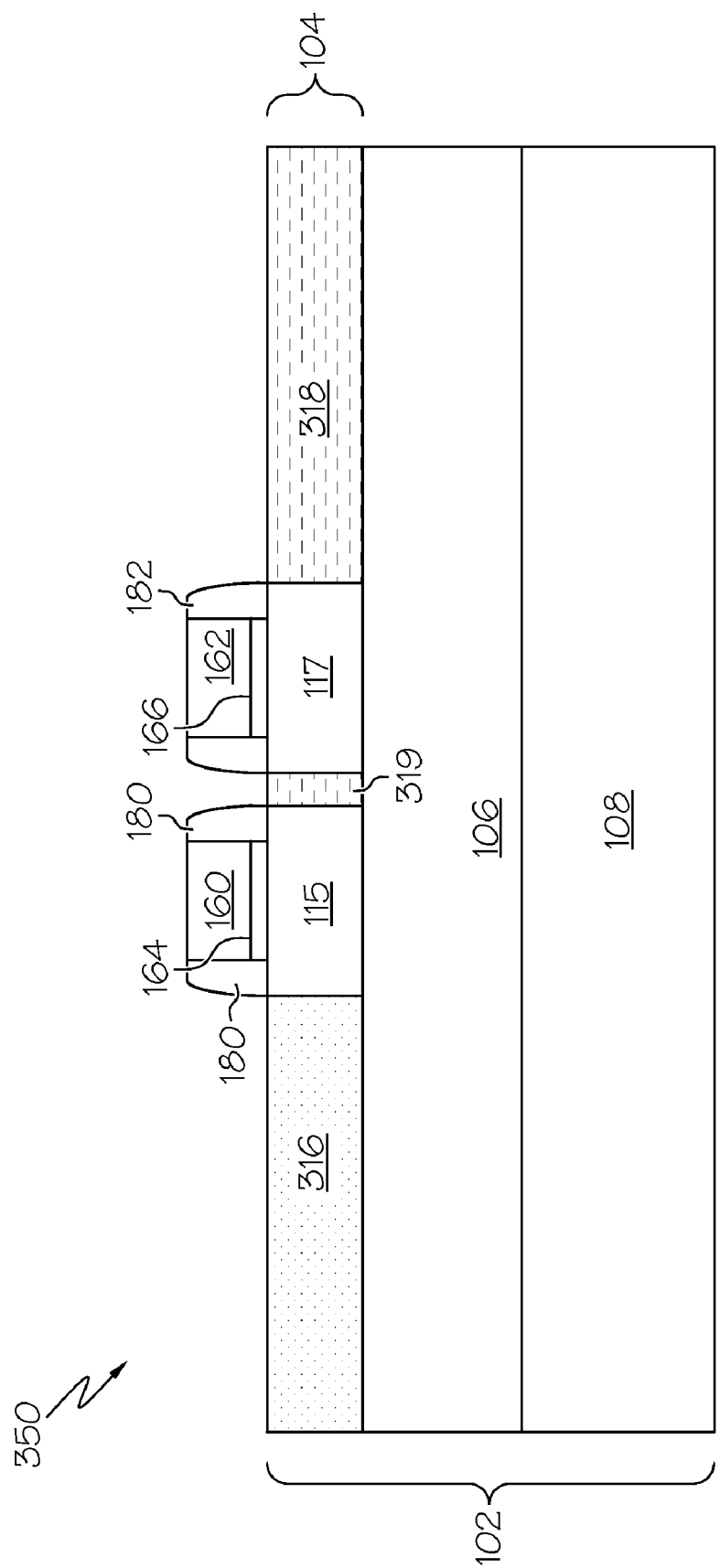

As illustrated in FIG. 15, after implanting N-type conductivity determining impurities, the patterned mask material 340 is removed. The resulting structure 350 in FIG. 14 can then (optionally) be annealed, for instance using a Rapid Thermal Annealing (RTA) process to cause outward lateral diffusion of dopants in the highly-doped P+-type anode region 116, the highly-doped N+-type separation region 119 and the N+-type cathode region 118, as illustrated in FIG. 16.

Figure 16:
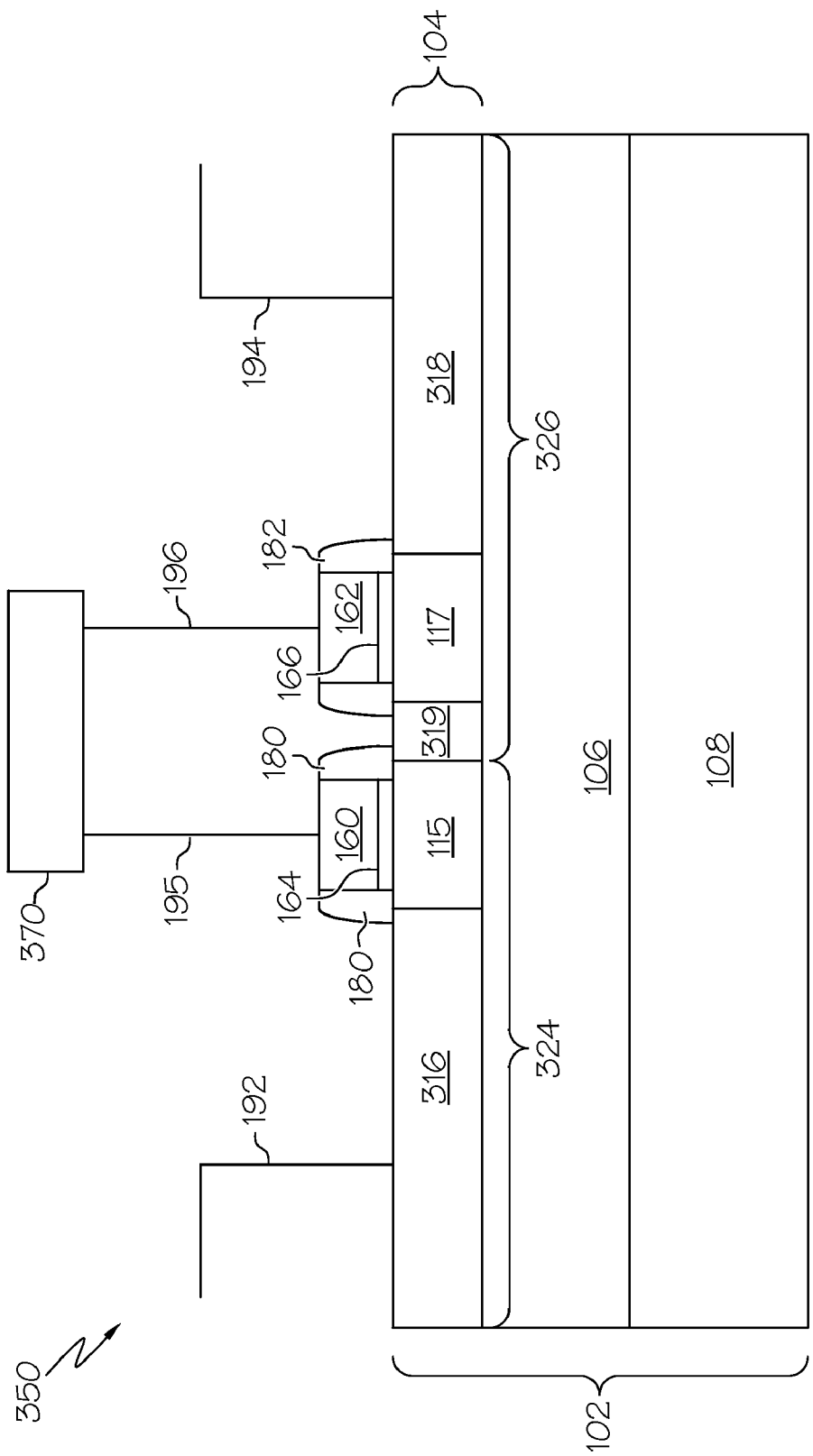

At the stage of processing shown in FIG. 16, the cross-sectional structure of the ESD protection device 350 is identical to that of the ESD protection device 150 of FIG. 9 except that the doping of the material used for the separation region 319 is different, and therefore the device 350 operates as a "normally-off" enhanced field effect diode (FED). The semiconductor substrate 104 includes a P+-type anode region 316 and an N+-type cathode region 318. The P+-type anode region 316 of semiconductor layer 104 is separated from the N+-type cathode region 318 by the first P-well device region 115, the highly-doped N+-type separation region 319 and the second P-well device region 117. A gate electrode structure is formed over each P-well device region 115, 117, where each of the gate electrode structures comprises a gate insulator layer 164, 166, a gate electrode 160, 162 overlying the gate insulator layer 164, 166, and spacers 180, 182 adjacent a first sidewall and a second sidewall of the gate electrode 160, 162.

Although not illustrated, the device 350 can be completed as described above with respect to FIG. 9. In FIG. 16, the contact plugs are represented by reference numerals 192, 194-196. The contact plugs 195, 196 can eventually be connected to a bias circuit 170 which controls operation of the device 350 during different modes of operation (i.e., ESD operation versus non-ESD operation).

The bias circuit 170 operates to control a bias voltage applied to gate electrodes 160, 162. The bias voltage which the bias circuit 170 applies to the gate electrodes 160, 162 depends on the operating state of the circuit that the ESD protection device 350 is protecting from an ESD event. Depending upon how the gate electrodes 160, 162 are biased, the semiconductor layer 104 of the ESD protection device 350 exhibits different arrangements of P-N junctions. The ESD protection device 350 is a normally-off enhanced field effect diode (FED) meaning that during normal operation, the ESD protection device 350 operates in its regular, unbiased state, and that during an ESD event biasing of the ESD protection device 350 protects a core circuit (not shown) against an ESD event. Table 3 summarizes operation of the ESD protection device 350 (or the "normally-off enhanced FED") during its different operating modes when the separation region 319 is N+-type material.

TABLE 3

| OPER-ATING MODE | SUBSTRATE REGIONS | | | | RESULT |
| --- | --- | --- | --- | --- | --- |
| | 316 | 115 | 319 | 117 | 318 | |
| ESD | P+ | N (INVERTS) | N+ | N (INVERTS) | N+ | DIODE |
| NORMAL | P+ | P | N+ | P | N+ | SERIES DIODES |

During normal circuit operation or "non-ESD operation" the bias circuit 170 does not apply a bias voltage so that the gate electrodes 160, 162 are unbiased or "electrically floating." This causes the well device regions 115, 117 under gate electrodes 160, 162 to remain P-type which results in a series P+ P N+ P N+ profile across semiconductor layer 104. One PN junction is formed between device region 115 and highly-doped N+-type separation region 319, another PN junction is formed between device region 117 and highly-doped P+-type separation region 319, while another PN junction is formed between device region 117 and highly-doped N+-type cathode region 318. ESD protection device 150 is configured such that P+-type anode region 316 is positively biased with respect to N+-type cathode region 318. As such, during normal operation, the semiconductor layer 104 is configured like a forward-biased diode 124 in series with another forward-biased diode 126, and the semiconductor layer 104 operates like a PNPN (SCR) structure where its turn-on voltage is dependent on an energy barrier height of the central reverse bias PN junction formed between device region 115 and highly-doped P+-type separation region 119. Because the ESD protection device 150 operates like two diodes in series (or alternatively as a PNPN SCR structure) during normal operation, the ESD protection device 350 has a relatively high impedance and is resistant to conduction of a current across the semiconductor material layer 104 of the ESD protection device 350. As described above, the ESD protection device 350 can be used in high speed or RF I/O pads as well as for low leakage/low power pads. The ESD protection device 350 effectively behaves like an open circuit with respect to the core circuit being protected.

By contrast, when an ESD event occurs, the bias circuit 170 applies a high positive bias voltage to both gate electrodes 160, 162 which initially causes depletion in the P-well device regions 115, 117 underneath gate electrodes 160, 162 and as the high bias voltage increases eventually inverts the surface conductivity of the P-well device regions 115, 117 so that the P-well device regions 115, 117 behave like N-type material. This results in a series P+ N N+ N N+ profile across semiconductor layer 104 such that semiconductor layer 104 has one PN junction between N-well device region 115 and P+-type anode region 316. Therefore, during an ESD event, the ESD protection device 350 behaves as a single forward-biased diode and the on-voltage of ESD protection device 350 is reduced to about 0.7 volts. Accordingly, during an ESD event, it is relatively easy to cause conduction of a current across the semiconductor material layer 104 of the ESD protection device 350 and therefore the ESD protection device 350 effectively operates as a short circuit which shorts the current resulting from the ESD event to ground thereby protecting the core circuit.

The device 350 illustrated in FIG. 15 can be fabricated in an alternative complementary conductivity-type embodiment, where the starting substrate is lightly-doped with N-type conductivity determining impurities and is therefore an N-type substrate 104. In this embodiment, the well device regions 115, 117 are N-well device regions 115, 117, and the separation region 319 is doped with P-type impurities to form a highly-doped P+-type separation region 319. ESD protection device 350 is configured such that P+-type anode region 316 is positively biased with respect to N+-type cathode region 318. Table 4 illustrates operation of the normally-off FED 350 when the substrate 104 is an N-type substrate 104, regions 115, 117 are N-type material and the separation region 319 is a highly doped P+-type material.

TABLE 4

| OPERATING MODE | SUBSTRATE REGIONS | | | | | RESULT |
|---|---|---|---|---|---|---|
| | 316 | 115 | 319 | 117 | 318 | |
| ESD | P+ | P (INVERTS) | P+ | P (INVERTS) | N+ | DIODE |
| NORMAL | P+ | N | P+ | N | N+ | SERIES DIODES |

During normal circuit operation or "non-ESD operation" when there is not an ESD event, the bias circuit 170 applies no bias voltage so that the gate electrodes 160, 162 are unbiased or "electrically floating." This causes the well device regions 115, 117 under gate electrodes 160, 162 to remain N-type which results in a series P+ N P+ N N+ profile across semiconductor layer 104. One PN junction is formed between P+-type anode region 316 and N-type device region 115, another PN junction is formed between N-type device region 115 and highly-doped P+-type separation region 319, while another PN junction is formed between device region 117 and highly-doped P+-type separation region 319. As such, the semiconductor layer 104 is configured like a forward-biased diode 324 in series with another forward-biased diode 326. Because the impedance of ESD protection device 350 is relatively high, the ESD protection device 350 is resistant to conduction of a current across the semiconductor material layer 104 of the ESD protection device 350. Therefore, the ESD protection device 350 effectively behaves like an open circuit with respect to the core circuit being protected.

By contrast, when an ESD event occurs, the bias circuit 170 applies a high negative bias voltage to both gate electrodes 160, 162 which initially causes depletion in the N-well device regions 115, 117 underneath gate electrodes 160, 162 and as the high bias voltage increases eventually inverts the surface conductivity of the N-well device regions 115, 117 so that the N-well device regions 115, 117 behave like P-type material. This results in a series P+ P P+ P N+ profile across semiconductor layer 104 such that semiconductor layer 104 has one PN junction between P-well device region 117 and N+-type cathode region 318. Therefore, during an ESD event, the ESD protection device 350 behaves as a single forward-biased diode and the on-voltage of ESD protection device 350 is reduced to about 0.7 volts. Accordingly, during an ESD event, the ESD protection device 350 has a relatively low impedance and allows conduction of a current across the semiconductor material layer 104 of the ESD protection device 350 which means that the ESD protection device 350 effectively operates as a short circuit which shorts the current resulting from the ESD event to ground thereby protecting the core circuit.

One implementation of the ESD protection device 350 used as a local clamping circuit will be discussed below with respect to FIG. 17.

Figure 17:
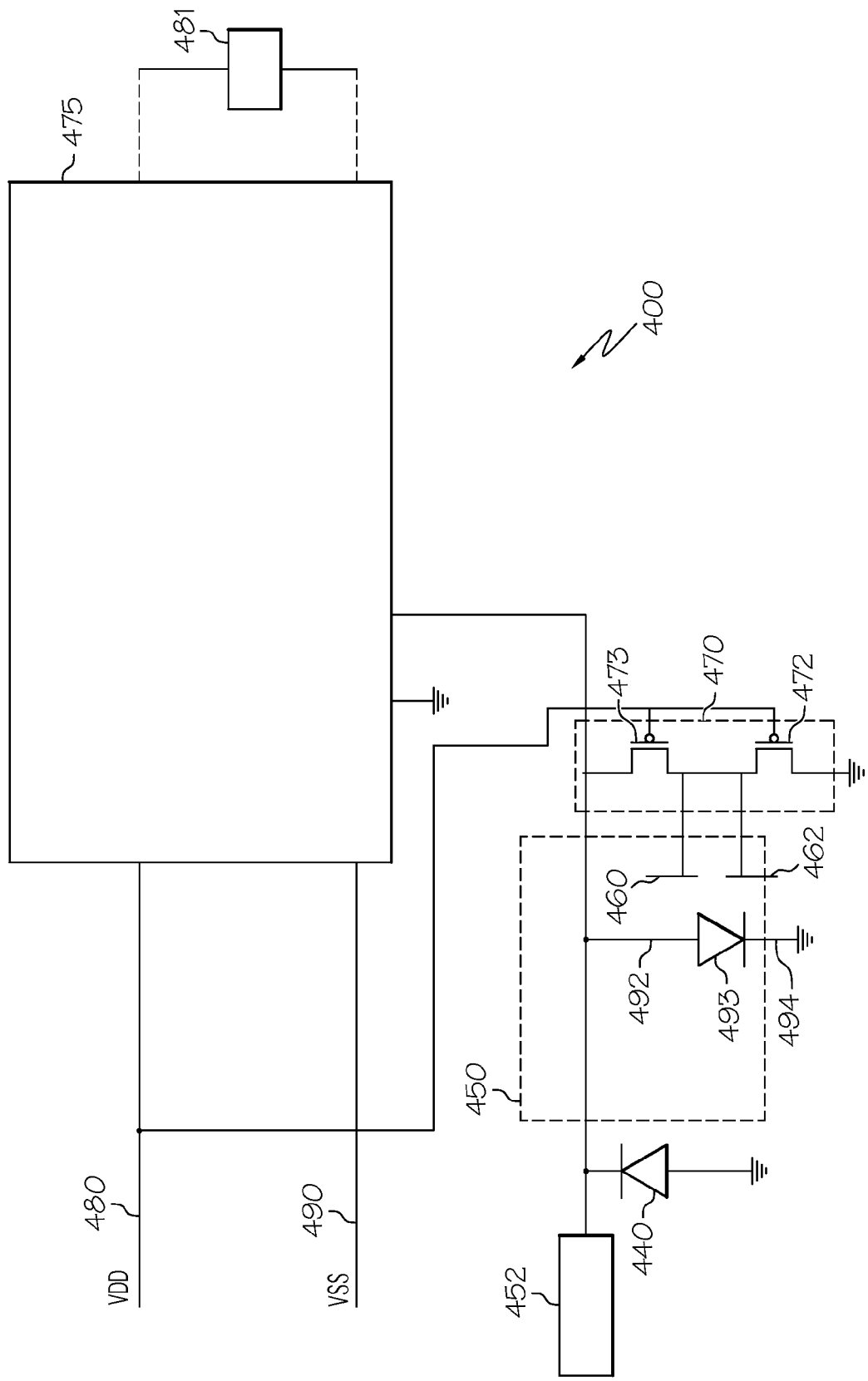
FIG. 17 is a schematic circuit diagram of an input/output (I/O) circuit which implements the ESD protection device of FIG. 16.

FIG. 17 is a schematic circuit diagram of an input/output (I/O) circuit 400 which implements the ESD protection device 450. The ESD protection device 450 is identical to the ESD protection device 350 in FIG. 16. As above, the I/O circuit 400 includes an I/O pad 452, an ESD diode 440, an ESD protection device 450, a bias circuit 470, a positive (VDD) supply rail 480, a negative (VSS) supply rail 490, a circuit 475 to be protected from an ESD event, and a supply clamp 481. In this embodiment, ESD protection device 450 is implemented as a local clamping circuit with respect to the I/O pad 452, as described above.

When the circuit is operating normally, the bias circuit 470, which is an inverter in this embodiment, does not apply any voltage to the gates 460, 462 of the ESD protection device 450 thereby causing the ESD protection device 450 to operate in its unbiased state. Thus, during normal operation, the ESD protection device 450 operates like two diodes in series. The series diodes have a relatively high impedance and are resistant to conduction of a current across the ESD protection device 450. During a positive ESD event a large voltage is applied to I/O pad 452 which causes a large current to flow towards the ESD protection device 450. During a positive ESD event, the large ESD voltage applied to I/O pad 452 causes the bias circuit 470 to apply a high bias voltage to the gates 460, 462 of the ESD protection device 450 (i.e., the large voltage applied to I/O pad 452 controls the voltage to the gates 460, 462). Accordingly, the ESD protection device 450 operates like a single forward-biased diode and the current flows through from the anode 492 to the cathode 494 to ground. Because the ESD protection device 450 operates like a single forward-biased diode the ESD protection device 450 conducts a current more easily during an ESD event (i.e., effectively appears as a short circuit). The ESD diode 440 is used during an opposite polarity situation (i.e., a negative ESD event) where voltage on I/O pad 452 is pulled below ground which forward biases ESD diode 440. In this situation, the ESD protection device 450 is reverse biased and does nothing. As above the ESD protection device 450 can also be implemented within the supply clamp 481 for high voltage supplies.

Thus, a number of ESD protection devices (or "enhanced FEDs") have been disclosed which can be implemented with different I/O circuits. The different embodiments of ESD protection devices disclosed herein can be implemented within different process integration techniques, and are also compatible with the standard SOI fabrication techniques so that no special masks or implants required. The ESD protection devices can provide ESD protection for I/O circuits fabricated on SOI technology which require high speed and low leakage. During normal operation, the ESD protection devices disclosed herein exhibit low loading capacitance and low leakage due to the presence of a PNPN structure. In other words, because two diodes are used in series, the series combination has a capacitance lower than that of a single protection diode. The lower capacitance allows the ESD protection device to be used in conjunction with high speed (i.e., radio-frequency) I/O pads and/or low leakage/low power I/O pads. The ESD protection devices also provide higher current carrier capability normally associated with conventional diode-based ESD protection devices. The ESD protection devices also make it easier to control the impedance across the ESD protection device without compromising its ESD operation.

Conventional ESD protection devices used with SOI technology include SOI diodes, NMOS transistors and Silicon Controlled rectifiers (SCR) structures. SOI diodes and SCR structures can handle large current but their turn-on voltage can not be controlled. NMOS transistors can provide controllable turn-on voltage via gate biasing, but can not handle large currents. The ESD protection devices described above can handle large currents while having a gate controllable impedance which make the ESD protection devices suitable for local clamping over wide range of normal operating voltages.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A device, comprising:
a semiconductor-on-insulator (SOI) structure comprising a carrier wafer, a silicon substrate, and insulating layer is disposed between the carrier wafer and the silicon substrate, comprising:
a first conductivity-type diode region disposed within the silicon substrate and that extends to the insulating layer, wherein the first conductivity-type is $P^+$;
a first well device region disposed within the silicon substrate and that extends to the insulating layer, wherein the first well device region is directly in series with and in physical contact with the first conductivity-type diode region, wherein the first well device region is a first P-well device region;
a $P^+$-type separation region disposed within the silicon substrate and that extends to the insulating layer, wherein the $P^+$-type separation region is in series with the first well device region and has a single $P^+$ conductivity-type;
a second well device region disposed within the silicon substrate and that extends to the insulating layer, wherein the second well device region is in series with the $P^+$-type separation region, wherein the second well device region is a second P-well device region;
a second conductivity-type diode region disposed within the silicon substrate, wherein the second conductivity-type diode region is disposed within the silicon substrate and extends to the insulating layer, wherein the second conductivity-type diode region is in series with the second well device region, wherein the second conductivity-type is $N^+$; and
a first gate electrode disposed overlying the first well device region of the silicon substrate;
a second gate electrode disposed overlying the second well device region of the silicon substrate;
a circuit to be protected from an electrostatic discharge event; and
a bias circuit coupled to the first gate electrode and the second gate electrode, wherein the bias circuit comprises: means for applying a positive bias voltage to both the first gate electrode and the second gate electrode during normal operation, and stopping application of the positive bias voltage to both the first gate electrode and the second gate electrode in response to an electrostatic discharge event.

2. The device according to claim 1, wherein the first well device region is directly in series with and in physical contact with the first conductivity-type diode region without intervening regions disposed between the first well device region and the first conductivity-type diode region, and wherein the second conductivity-type diode region is directly in series with and in physical contact with the second well device region without intervening regions disposed between the second well device region and the second conductivity-type diode region.

3. The device according to claim 1, wherein the first conductivity-type diode region is a first conductivity-type anode region.

4. The device according to claim 3, wherein the second conductivity-type diode region is a second conductivity-type cathode region.

5. The device according to claim 1, wherein no other intervening well regions are disposed within the silicon substrate between the first well device region and the second well device region.

6. The device according to claim 1, wherein no other intervening gate electrodes are disposed overlying the silicon substrate between the first gate electrode and the second gate electrode.

7. The device according to claim 1, wherein the $P^+$-type separation region is directly in series with and in physical contact with the first well device region, wherein the second well device region is directly in series with and in physical contact with the $P^+$-type separation region.

8. The device according to claim 1, wherein the $P^+$-type separation region is configured such that the $P^+$-type separation region is unbiased and electrically floating.

9. A device, comprising:
a semiconductor-on-insulator (SOI) structure comprising a carrier wafer, a silicon substrate, and insulating layer is disposed between the carrier wafer and the silicon substrate, comprising:
a first conductivity-type diode region disposed within the silicon substrate and that extends to the insulating layer, wherein the first conductivity-type is $P^+$;
a first well device region disposed within the silicon substrate and that extends to the insulating layer, wherein the first well device region is directly in series with and in physical contact with the first conductivity-type diode region, wherein the first well device region is a first N-well device region;
a $P^+$-type separation region disposed within the silicon substrate and that extends to the insulating layer, wherein the $P^+$-type separation region is in series with the first well device region and has a single $P^+$ conductivity-type;
a second well device region disposed within the silicon substrate and that extends to the insulating layer, wherein the second well device region is in series with the $P^+$-type separation region, wherein the second well device region is a second N-well device region;
a second conductivity-type diode region disposed within the silicon substrate, wherein the second conductivity-type diode region is disposed within the silicon substrate and extends to the insulating layer, wherein the second conductivity-type diode region is in series with the second well device region, wherein the second conductivity-type is $N^+$; and
a first gate electrode disposed overlying the first well device region of the silicon substrate;
a second gate electrode disposed overlying the second well device region of the silicon substrate;
a circuit to be protected from an electrostatic discharge event; and
a bias circuit coupled to the first gate electrode and the second gate electrode, wherein the bias circuit comprises: means for applying a negative bias voltage to both the first gate electrode and the second gate electrode during normal operation, and stopping application of the negative bias voltage to both the first gate electrode and the second gate electrode in response to an electrostatic discharge event.

10. The device according to claim 9, wherein the first well device region is directly in series with and in physical contact with the first conductivity-type diode region without intervening regions disposed between the first well device region and the first conductivity-type diode region, and wherein the second conductivity-type diode region is directly in series with and in physical contact with the second well device region without intervening regions disposed between the second well device region and the second conductivity-type diode region.

11. The device according to claim 9, wherein the first conductivity-type diode region is a first conductivity-type anode region.

12. The device according to claim 11, wherein the second conductivity-type diode region is a second conductivity-type cathode region.

13. The device according to claim 9, wherein no other intervening well regions are disposed within the silicon substrate between the first well device region and the second well device region.

14. The device according to claim 9, wherein no other intervening gate electrodes are disposed overlying the silicon substrate between the first gate electrode and the second gate electrode.

15. The device according to claim 9, wherein the separation region is directly in series with and in physical contact with the first well device region, wherein the second well device region is directly in series with and in physical contact with the $P^+$-type separation region.

16. The device according to claim 9, wherein the $P^+$-type separation region is configured such that the $P^+$-type separation region is unbiased and electrically floating.

17. A device, comprising:
a semiconductor-on-insulator (SOI) structure comprising a carrier wafer, a silicon substrate, and insulating layer is disposed between the carrier wafer and the silicon substrate, comprising:
a first conductivity-type diode region disposed within the silicon substrate and that extends to the insulating layer, wherein the first conductivity-type is $P^+$;
a first well device region disposed within the silicon substrate and that extends to the insulating layer, wherein the first well device region is directly in series with and in physical contact with the first conductivity-type diode region, wherein the first well device region is a first P-well device region;
an $N^+$-type separation region disposed within the silicon substrate and that extends to the insulating layer, wherein the $N^+$-type separation region is in series with the first well device region and has a single $N^+$ conductivity-type;
a second well device region disposed within the silicon substrate and that extends to the insulating layer, wherein the second well device region is in series with the $N^+$-type separation region, wherein the second well device region is a second P-well device region;
a second conductivity-type diode region disposed within the silicon substrate, wherein the second conductivity-type diode region is disposed within the silicon substrate and extends to the insulating layer, wherein the second conductivity-type diode region is in series with the second well device region, wherein the second conductivity-type is $N^+$; and
a first gate electrode disposed overlying the first well device region of the silicon substrate;
a second gate electrode disposed overlying the second well device region of the silicon substrate;
a circuit to be protected from an electrostatic discharge event; and a bias circuit coupled to the first gate electrode and the second gate electrode, wherein the bias circuit comprises: means for applying a positive bias voltage to both the first gate electrode and the second gate electrode in response to an electrostatic discharge event, and stopping application of the positive bias voltage to both the first gate electrode and the second gate electrode so that the first gate electrode and the second gate electrode are configured to be electrically floating.

18. The device according to claim 17, wherein the first well device region is directly in series with and in physical contact with the first conductivity-type diode region without intervening regions disposed between the first well device region and the first conductivity-type diode region, and wherein the second conductivity-type diode region is directly in series with and in physical contact with the second well device region without intervening regions disposed between the second well device region and the second conductivity-type diode region.

19. The device according to claim 17, wherein the first conductivity-type diode region is a first conductivity-type anode region.

20. The device according to claim 19, wherein the second conductivity-type diode region is a second conductivity-type cathode region.

21. The device according to claim 17, wherein no other intervening well regions are disposed within the silicon substrate between the first well device region and the second well device region.

22. The device according to claim 17, wherein no other intervening gate electrodes are disposed overlying the silicon substrate between the first gate electrode and the second gate electrode.

23. The device according to claim 17, wherein the $N^+$-type separation region is directly in series with and in physical contact with the first well device region, wherein the second well device region is directly in series with and in physical contact with the separation region.

24. The device according to claim 17, wherein the $N^+$-type separation region is configured such that the separation region is unbiased and electrically floating.

25. A device, comprising:
a semiconductor-on-insulator (SOI) structure comprising a carrier wafer, a silicon substrate, and insulating layer is disposed between the carrier wafer and the silicon substrate, comprising:
a first conductivity-type diode region disposed within the silicon substrate and that extends to the insulating layer, wherein the first conductivity-type is $P^+$;
a first well device region disposed within the silicon substrate and that extends to the insulating layer, wherein the first well device region is directly in series with and in physical contact with the first conductivity-type diode region, wherein the first well device region is a first N-well device region;
an $N^+$-type separation region disposed within the silicon substrate and that extends to the insulating layer, wherein the $N^+$-type separation region is in series with the first well device region and has a single $N^+$ conductivity-type;
a second well device region disposed within the silicon substrate and that extends to the insulating layer, wherein the second well device region is in series with the $N^+$-type separation region, wherein the second well device region is a second N-well device region;
a second conductivity-type diode region disposed within the silicon substrate, wherein the second conductivity-type diode region is disposed within the silicon substrate and extends to the insulating layer, wherein the second conductivity-type diode region is in series with the second well device region, wherein the second conductivity-type is $N^+$; and
a first gate electrode disposed overlying the first well device region of the silicon substrate;
a second gate electrode disposed overlying the second well device region of the silicon substrate;
a circuit to be protected from an electrostatic discharge event; and
a bias circuit coupled to the first gate electrode and the second gate electrode, wherein the bias circuit comprises: means for applying a negative bias voltage to both the first gate electrode and the second gate electrode in response to an electrostatic discharge event, and stopping application of the negative bias voltage to both the first gate electrode and the second gate electrode so that the first gate electrode and the second gate electrode are configured to be electrically floating.

26. The device according to claim 25, wherein the first well device region is directly in series with and in physical contact with the first conductivity-type diode region without intervening regions disposed between the first well device region and the first conductivity-type diode region, and wherein the second conductivity-type diode region is directly in series with and in physical contact with the second well device region without intervening regions disposed between the second well device region and the second conductivity-type diode region.

27. The device according to claim 25, wherein the first conductivity-type diode region is a first conductivity-type anode region.

28. The device according to claim 27, wherein the second conductivity-type diode region is a second conductivity-type cathode region.

29. The device according to claim 25, wherein no other intervening well regions are disposed within the silicon substrate between the first well device region and the second well device region.

30. The device according to claim 25, wherein no other intervening gate electrodes are disposed overlying the silicon substrate between the first gate electrode and the second gate electrode.

31. The device according to claim 25, wherein the $N^+$-type separation region is directly in series with and in physical contact with the first well device region, wherein the second well device region is directly in series with and in physical contact with the $N^+$-type separation region.

32. The device according to claim 25, wherein the $N^+$-type separation region is configured such that the $N^+$-type separation region is unbiased and electrically floating.

* * * * *